United States Patent
Lee et al.

(10) Patent No.: US 11,574,662 B2
(45) Date of Patent: Feb. 7, 2023

(54) MEMORY DEVICES CONFIGURED TO GENERATE PULSE AMPLITUDE MODULATION-BASED DQ SIGNALS, MEMORY CONTROLLERS, AND MEMORY SYSTEMS INCLUDING THE MEMORY DEVICES AND THE MEMORY CONTROLLERS

(71) Applicant: Samsung Electronics Co., Ltd., Suwon-si (KR)

(72) Inventors: Sucheol Lee, Suwon-si (KR); Younghoon Son, Yongin-si (KR); Hyunyoon Cho, Uiwang-si (KR); Youngdon Choi, Seoul (KR); Junghwan Choi, Hwaseong-si (KR)

(73) Assignee: Samsung Electronics Co, Ltd.

( * ) Notice: Subject to any disclaimer, the term of this patent is extended or adjusted under 35 U.S.C. 154(b) by 0 days.

(21) Appl. No.: 17/347,998

(22) Filed: Jun. 15, 2021

(65) Prior Publication Data
US 2022/0076715 A1 Mar. 10, 2022

(30) Foreign Application Priority Data
Sep. 8, 2020 (KR) .......... 10-2020-0114871

(51) Int. Cl.
*G11C 7/10* (2006.01)
*G06F 13/16* (2006.01)
(Continued)

(52) U.S. Cl.
CPC ............ *G11C 7/1045* (2013.01); *G06F 13/16* (2013.01); *G11C 7/1051* (2013.01);
(Continued)

(58) Field of Classification Search
CPC ... G11C 7/1045; G11C 7/1051; G11C 7/1078; G06F 13/16; H03K 7/02; H03K 19/01742
(Continued)

(56) References Cited

U.S. PATENT DOCUMENTS 6,101,223 A 8/2000 Betts
7,126,378 B2 10/2006 Stojanovic et al.
(Continued)

FOREIGN PATENT DOCUMENTS

EP 1410588 A2 4/2004

OTHER PUBLICATIONS

"Extended European Search Report for European Application No. 21195402.9, dated Jan. 31, 2022, 9 pages".
(Continued)

*Primary Examiner* — Son L Mai
(74) *Attorney, Agent, or Firm* — Myers Bigel, P.A.

(57) ABSTRACT

A memory device as provided may apply a pulse amplitude modulation method to data (DQ) signal transmission/reception and may scale a DQ signal according to an operating frequency condition, so as to improve data transmission performance and effectively improve power consumption. The memory device includes a memory cell array, and a data input/output circuit configured to scale a DQ signal that includes data read from the memory cell array and output the scaled DQ signal. The data input/output circuit is configured to scale the DQ signal based on an n-level pulse amplitude modulation (PAMn) (where n is 4 or a greater integer) with a DQ parameter that corresponds an operating frequency condition and output the DQ signal. Other aspects include memory controllers that communicate with the memory devices, and memory systems that include the memory devices and memory controllers.

20 Claims, 18 Drawing Sheets

(51) Int. Cl.
  *H03K 7/02*      (2006.01)
  *H03K 19/017*   (2006.01)
(52) U.S. Cl.
  CPC ............. *G11C 7/1078* (2013.01); *H03K 7/02* (2013.01); *H03K 19/01742* (2013.01)
(58) Field of Classification Search
  USPC ......................................................... 711/154
  See application file for complete search history.

(56) References Cited

U.S. PATENT DOCUMENTS

| | | |
|---|---|---|
| 8,090,055 B2 | 1/2012 | Lui et al. |
| 8,166,379 B1 | 4/2012 | Wu et al. |
| 10,242,719 B2 | 3/2019 | Doo et al. |
| 11,194,726 B2 * | 12/2021 | Gans ................... G06F 13/1668 |
| 2002/0075968 A1 | 6/2002 | Zerbe et al. |
| 2019/0103149 A1 | 4/2019 | Hasbun et al. |
| 2022/0068332 A1 * | 3/2022 | Lee ...................... G11C 7/1066 |
| 2022/0068359 A1 * | 3/2022 | Shin .................... G11C 11/4074 |
| 2022/0121582 A1 * | 4/2022 | Jin ...................... H04L 25/4917 |

OTHER PUBLICATIONS

"Fujimoro Ichiro, "Evolution of Multi-Gigabit Wireline Transceivers in CMOS," 2014 IEEE Compund Semiconductor Integrated Circuit Symposium (CSICS), IEEE, Oct. 19, 2014".

* cited by examiner

[High Frequency Condition]

[Low Frequency Condition]

[Low Frequency Condition]

TB_1

| Operation Frequency Condition | VDD Level |
|---|---|
| RG_1 | VDD_LV_1 |
| RG_2 | VDD_LV_2 |
| ⋮ | ⋮ |
| RG_j | VDD_LV_j |

TB_2

| Operation Frequency Condition | Driving Strength |
|---|---|
| RG_1 | DS_1 |
| RG_2 | DS_2 |
| ⋮ | ⋮ |
| RG_k | DS_k |

TB_3

| Operation Frequency Condition | VDD Level | Driving Strength |
|---|---|---|
| RG_1 | VDD_LV_1 | DS_1 |
| RG_2 | VDD_LV_2 | DS_2 |
| ⋮ | ⋮ | ⋮ |
| RG_f | VDD_LV_f | DS_f |

MEMORY DEVICES CONFIGURED TO GENERATE PULSE AMPLITUDE MODULATION-BASED DQ SIGNALS, MEMORY CONTROLLERS, AND MEMORY SYSTEMS INCLUDING THE MEMORY DEVICES AND THE MEMORY CONTROLLERS

CROSS-REFERENCE TO RELATED APPLICATION

This application is based on and claims priority under 35 U.S.C. § 119 to Korean Patent Application No. 10-2020-0114871, filed on Sep. 8, 2020, in the Korean Intellectual Property Office, the disclosure of which is incorporated by reference herein in its entirety.

BACKGROUND

The present disclosure relates to memory devices, and more particularly, to memory devices configured to generate pulse amplitude modulation-based data (DQ) signals, memory controllers, and memory systems that include the memory devices and the memory controllers.

As mobile devices are rapidly distributed and Internet access rapidly increases, demand for high-capacity and high-speed data transmission has been increasing. However, it may be difficult to satisfy demands for the high-capacity and high-speed data transmission when using signal modulation methods based on non-return to zero (NRZ) type encodings.

Recently, research into pulse amplitude modulation (PAM) methods has been actively performed to investigate alternatives to NRZ-type encodings for signal processing methods adapted for high-capacity and high-speed data transmission. In addition, in some memory systems, techniques for storing high-capacity data and high-speed data transmission in response to a data request are increasingly desirable, and research into data transmission-related technologies suitable for characteristics of such memory system has been performed.

SUMMARY

The inventive concepts of the present disclosure provide memory devices, memory controllers, and memory system that include the memory devices and the memory controllers. More particularly, the inventive concepts of the present disclosure include the application of a pulse amplitude modulation method to a DQ signal transmission/reception in the memory system and the scaling of the DQ signal according to an operating frequency condition, so as to improve data transmission performance and effectively improve power consumption.

According to some aspects of the inventive concepts, a memory device includes a memory cell array and a data input/output circuit configured to scale a DQ signal that includes data read from the memory cell array and output the scaled DQ signal. The data input/output circuit may be configured to scale the DQ signal based on an n-level pulse amplitude modulation (PAMn) (where n is an integer greater than or equal to 4) with a DQ parameter that corresponds to an operating frequency condition and output the DQ signal.

According to some aspects of the inventive concepts, a memory system includes a memory device including a memory cell array and a memory controller configured to control memory operations of the memory device. The memory device and the memory controller may each be configured to transmit or receive a scaled DQ signal that is modulated based on n-level pulse amplitude modulation (PAMn) (where n is integer greater than or equal to 4). At least one of an interval between adjacent levels of the n levels and/or a transition slope between adjacent levels of the n levels of the scaled DQ signal is scaled according to an operating frequency condition of the memory system.

According to some aspects of the inventive concepts, a method of operating a memory device includes receiving a first read command according to a first operating frequency condition, generating and outputting a first DQ signal that is based on n-level pulse amplitude modulation (PAMn) and that corresponds to the first operating frequency condition, in response to the first read command, receiving a second read command according to a second operating frequency condition that is different from the first operating frequency condition, and generating and outputting a second DQ signal that is based on the PAMn and that corresponds to the second operating frequency condition, in response to the second read command, wherein the first DQ signal is different from at least one of an interval between adjacent levels of the n levels and a transition slope between the adjacent levels of the n levels of the second DQ signal. N may be an integer greater than or equal to four.

BRIEF DESCRIPTION OF THE DRAWINGS

Aspects of the present inventive concepts will be more clearly understood from some examples of embodiments thereof described in the following detailed description taken in conjunction with the accompanying drawings in which.

DETAILED DESCRIPTION

Hereinafter, some examples of embodiments of the inventive concepts will be described in detail with reference to accompanying drawings.

Figure 1:
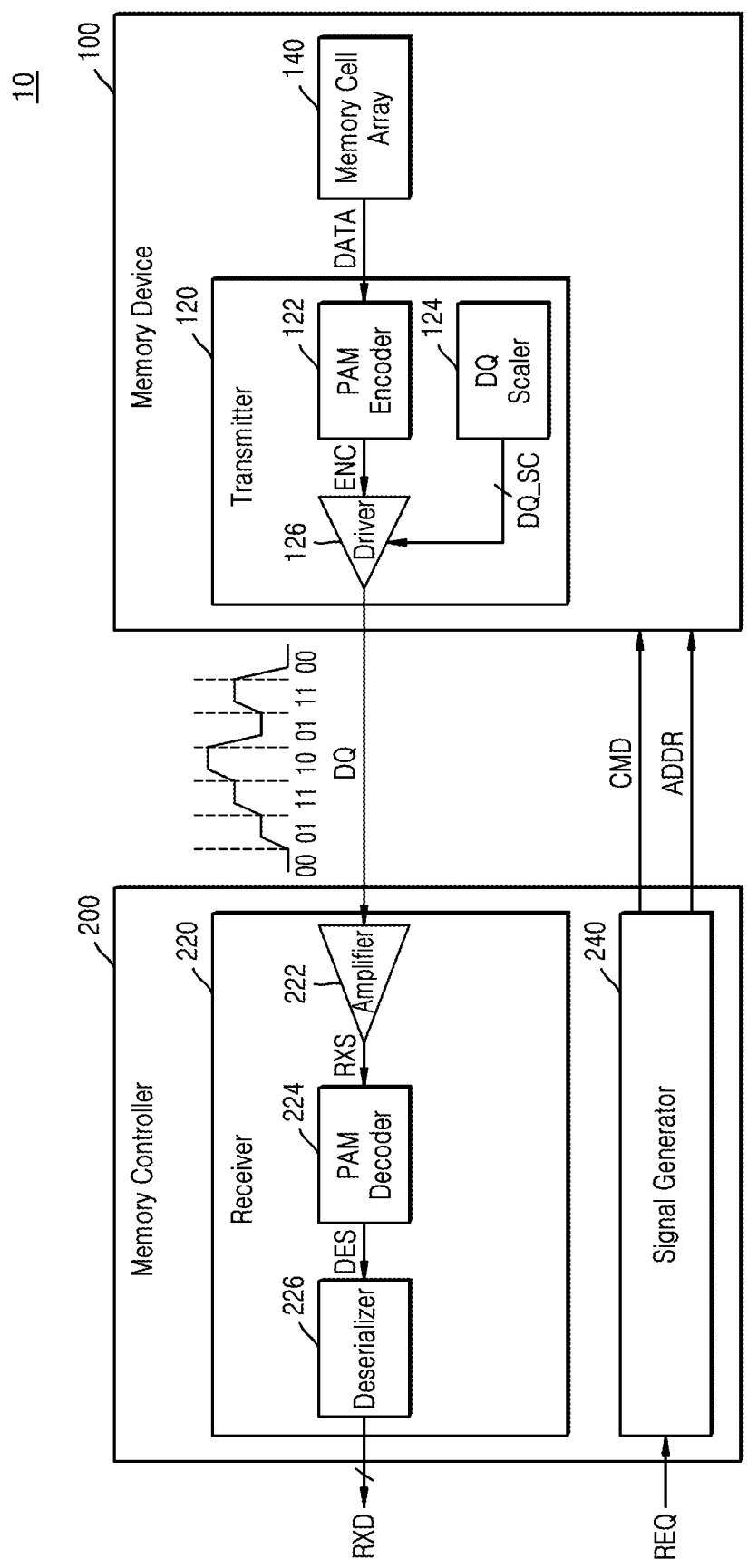
FIG. 1 is a block diagram of a memory system according to some embodiments of the inventive concepts.

FIG. 1 is a block diagram of a memory system 10 according to some embodiments of the inventive concepts. The memory system 10 may include a memory device 100 and a memory controller 200. In the embodiments that will be described below, the memory device 100 included in the memory system 10 is shown as a dynamic random access memory (DRAM), that is, a volatile memory, but the present disclosure and the inventive concepts are not limited thereto. For example, other kinds of volatile memory may be applied as the memory device 100. Alternatively, the memory device 100 according to one or more embodiments of the inventive concepts may include a non-volatile memory such as a resistive memory device, a flash memory device, or the like.

The memory device 100 may include a transmitter 120 and a memory cell array 140. The memory controller 200 may include a receiver 220 and a signal generator 240.

The transmitter 120 according to some embodiments of the inventive concepts may include a PAM encoder 122, a DQ scaler 124, and a driver 126. The transmitter 120 may generate and output a DQ signal DQ that includes symbols of n bits according to $2^n$-level pulse amplitude modulation (PAMn) to represent $2^n$ data values. For example, the transmitter 120 may generate and output a DQ signal DQ including symbols of 2 bits according to PAM4 and representing four data values (00, 01, 11, 10). In FIG. 1, the DQ signal DQ is implemented as a single signal to be transmitted/received through a single line between the memory device 100 and the memory controller 200. In some embodiments, the DQ signal DQ may be implemented as a differential signal and transmitted/received through differential lines between the memory device 100 and the memory controller 200.

In some embodiments and situations, for example under high operating frequency conditions of the memory device 100, sufficient eye-opening height and eye-opening width of the DQ signal DQ may be needed. The eye-opening height may be determined according to a level of a power voltage applied to the driver 126 and the eye-opening width may vary depending on a driving strength of the driver 126. On the other hand, in situations where the operating frequency condition is low, a high level of the power voltage and/or the driving strength of the driver 126 that may have been set to ensure proper operating characteristics under the high operating frequency condition may result in unnecessary power consumption. To address the above and other issues, the transmitter 120 according to some embodiments of the inventive concepts will be described herein.

The transmitter 120 according to some embodiments may scale the DQ signal DQ with a DQ parameter that corresponds to and/or is suitable for the operating frequency condition of the memory system 10. Hereinafter, scaling may denote an operation of adjusting the DQ parameter of the DQ signal DQ. The DQ parameter may include at least one of an interval between adjacent levels and a transition slope between the adjacent levels in the DQ signal DQ. That is, different DQ parameters, each of which may respectively correspond to and/or be suitable for each of a plurality of operating frequency conditions, may be different from one another, and the transmitter 120 may scale the DQ signal DQ with a DQ parameter that is suitable for a corresponding operating frequency condition, so as to perform an optimal data transmission operation under the corresponding operating frequency condition.

The signal generator 240 of the memory controller 200 may generate and provide a command CMD and an address ADDR to the memory device 100, which may be used to control the memory operation, in response to a request REQ transmitted from a host (not shown). In some embodiments, the memory controller 200 may operate in synchronization with an operating frequency of the host (not shown), and the signal generator 240 may generate and provide a signal representing the operating frequency to the memory device 100. In some embodiments, the signal indicating the operating frequency may be transmitted to the memory device 100 via a pin for transmitting the command CMD, a pin for transmitting the address ADDR, or a separate pin. In some embodiments, when the memory device 100 is a DRAM device, the signal generator 240 may generate a mode register set (MRS) signal including the signal indicating the operating frequency and may provide the MRS signal to the memory device 100.

When the command CMD is a read command, the transmitter 120 may receive read data DATA from the memory cell array 140. The PAM encoder 122 may encode the read data DATA based on PAM to generate encoding data ENC, and then may provide the encoding data ENC to the driver 126. The DQ scaler 124 generates a DQ scaling signal DQ_SC for scaling the DQ signal DQ with the DQ parameter matching the operating frequency condition and provides the DQ scaling signal DQ_SC to the driver 126.

In some embodiments, the DQ scaler 124 may determine the DQ parameter that matches the operating frequency condition by receiving operating frequency information that indicates the operating frequency condition of the memory device 200. That is, the DQ scaler 124 may determine a value of the DQ parameter that varies depending on the operating frequency condition. The DQ scaler 124 may generate the DQ scaling signal DQ_SC corresponding to the determined DQ parameter and may provide the DQ scaling signal DQ_SC to the driver 126. In some embodiments, the DQ scaling signal DQ_SC may include at least one of a power voltage of the driver 126 and/or a code signal for adjusting the driving strength of the driver 126.

In some embodiments, the driver 126 may output the DQ signal DQ by driving the encoding data ENC based on the DQ scaling signal DQ_SC. In detail, the DQ signal DQ may be scaled such that at least one of the interval between adjacent levels and/or the transition slope between the adjacent levels may match the operating frequency condition, as described in greater detail below with reference to FIGS. 2A to 2C.

In some embodiments, the receiver 220 of the memory controller 200 may include an amplifier 222, a PAM decoder 224, and a deserializer 226. For example, the memory device 100 and the memory controller 200 may transmit/receive the DQ signal DQ to/from each other in a serial interfacing method, and the memory controller 200 may communicate with the host (not shown) in a parallel interfacing method. However, the present disclosure is not limited thereto, and in some embodiments the memory controller 200 may communicate with the host (not shown) in a serial interfacing method, and the deserializer 226 may be omitted. In other words, the deserializer 226 may be optional.

The amplifier 222 may amplify the DQ signal DQ to generate an RX signal RXS. In addition, the amplifier 222 may have an input impedance for impedance matching with the transmitter 120. The PAM decoder 224 may receive the RX signal RXS from the amplifier 222 and may decode the RX signal RXS based on PAM to generate a decoding signal DES. In some embodiments, the receiver 220 may further include an equalizer (not shown) to perform equalization for compensating for distortion of the DQ signal DQ. The deserializer 226 may receive the decoding signal DES and may convert the decoding signal DES to RX data RXD. For example, the decoding signal DES may include a series of symbols each having a unit interval (UI) of '1/baud rate', and the deserializer 226 may output the RX data RXD of x bits (where x is a positive integer) at a frequency of 'baud rate/n'. The receiver 220 may provide the RX data RXD to the host (not shown).

In some embodiments, the transmitter 120 may be implemented to be included in a data input/output circuit (not shown) of the memory device 100, and some embodiments of the inventive concepts may be also applied to a transmitter (not shown) included in the memory controller 200. Detailed descriptions thereof will be provided herein.

The transmitter 120 according to some embodiments of the inventive concepts may scale the DQ signal DQ based on PAM to correspond to and/or be suitable for different operating frequency conditions of the memory device 100, and thus, may provide improved data transmission performance and may effectively improve power consumption.

Figure 2A:
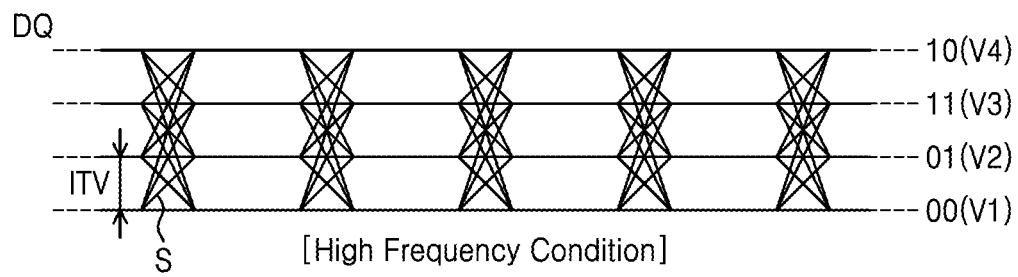
FIGS. 2A to 2C are diagrams for describing a scaled DQ signal according to some embodiments of the inventive concepts.
Figure 2B:
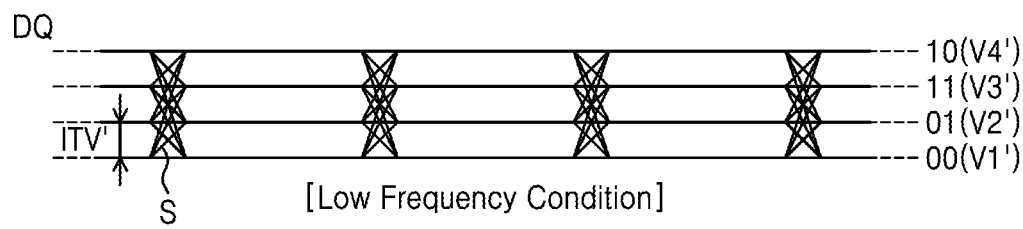
Figure 2C:
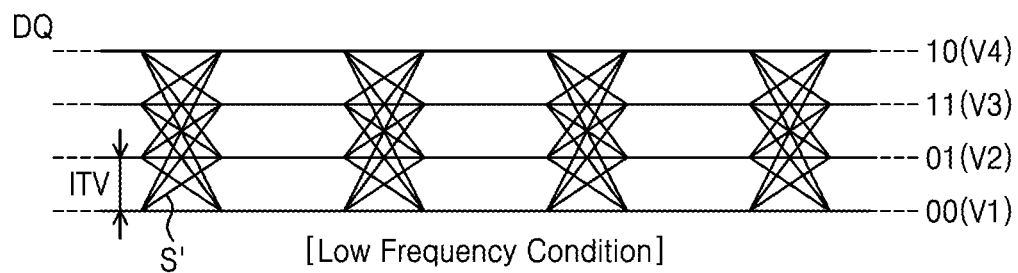

FIGS. 2A to 2C are diagrams for describing a DQ signal DQ that is scaled according to some embodiments of the inventive concepts. FIGS. 2A and 2B show the DQ signal DQ based on PAM4 having four levels, but the present disclosure is not limited thereto. That is, the inventive concepts may be also applied to a DQ signal DQ based on PAMn having 8 or more levels.

FIG. 2A shows a DQ signal DQ under the high operating frequency condition. A lowest level, that is, a first level V1, of the DQ signal DQ may be mapped to 2-bit data '00', and a highest level, that is, a fourth level V4, of the DQ signal DQ may be mapped to 2-bit data '10'. Intermediate (second and third) levels V2 and V3 of the DQ signal DQ may be mapped to 2-bit data '01, 11'. The mapping between the voltage levels V1 to V4 and data may be performed based on a gray code method, although the present disclosure is not limited thereto, and in some embodiments the mapping method may be changed according to various purposes. In some embodiments, the DQ signal DQ may have an interval ITV between adjacent levels and a transition slope S between the adjacent levels, which have values matching the high operating frequency condition.

FIG. 2B shows a DQ signal DQ under the low operating frequency condition. FIG. 2B shows the DQ signal DQ that is obtained by down scaling the power voltage of the driver 126 in FIG. 1 to be less than that of FIG. 2A under the low operating frequency condition. A lowest level, that is, a first level V1', of the DQ signal DQ may be mapped to 2-bit data '00', and a highest level, that is, a fourth level V4', of the DQ signal DQ may be mapped to 2-bit data '10'. Intermediate (second and third) levels V2' and V3' of the DQ signal DQ may be mapped to 2-bit data '01, 11'. In some embodiments, the second to fourth levels V2' to V4' may be lower than the second to fourth levels V2 to V4 of FIG. 2A. Accordingly, an interval ITV' between the adjacent levels in the DQ signal DQ may be less than the interval ITV between the adjacent levels in the DQ signal DQ of FIG. 2A. In addition, in some embodiments, the transition slope S between the adjacent levels in the DQ signal DQ may be equal to that of the DQ signal DQ in FIG. 2A.

FIG. 2C shows a DQ signal DQ under the low operating frequency condition. FIG. 2C shows the DQ signal DQ that is obtained by down scaling such that the driving strength of the driver 126 in FIG. 1 to be less than that of FIG. 2A under the low operating frequency condition. A lowest level, that is, a first level V1, of the DQ signal DQ may be mapped to 2-bit data '00', and a highest level, that is, a fourth level V4, of the DQ signal DQ may be mapped to 2-bit data '10'. Intermediate (second and third) levels V2 and V3 of the DQ signal DQ may be mapped to 2-bit data '01, 11'. In some embodiments, the transition slope S' between the adjacent levels in the DQ signal DQ may be less steep than the transition slope S between the adjacent levels in the DQ signal DQ of FIG. 2A. In addition, the first to fourth levels V1 to V4 of the DQ signal DQ may be equal to those of the DQ signal DQ in FIG. 2A, and accordingly, the interval ITV between the adjacent levels may be equal to that of the DQ signal DQ in FIG. 2A.

In FIGS. 2B and 2C, the interval between the adjacent levels and the transition slope between the adjacent levels of the DQ signal DQ are independently scaled from each other, but the present disclosure is not limited thereto, and as such, in some embodiments the interval between the adjacent levels and the transition slope between the adjacent levels in the DQ signal DQ may be simultaneously scaled to be complementary with each other. Also, the operating frequency condition may be classified in more detail or at a more granular level than the high operating frequency condition and the low operating frequency condition (e.g., a first operating frequency condition, a second operating frequency condition, a third operating frequency condition, and so on), and in correspondence with the more detailed operating frequency conditions, the interval between the adjacent levels and the transition slope between the adjacent levels in the DQ signal DQ may be variously scaled.

Figure 3A:
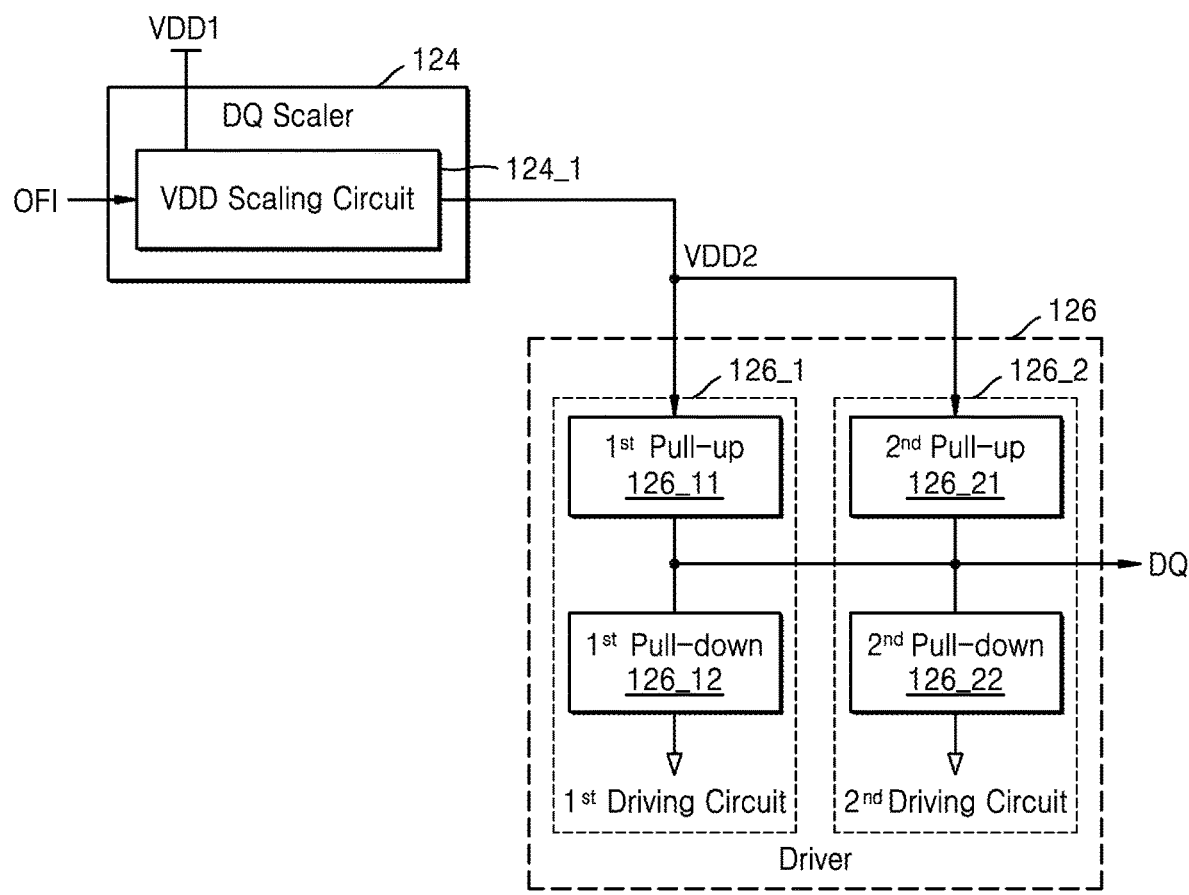
FIGS. 3A to 3C are diagrams for describing an operation of a DQ scaler of FIG. 1, according to some embodiments of the inventive concepts.
Figures 3B, 3C:
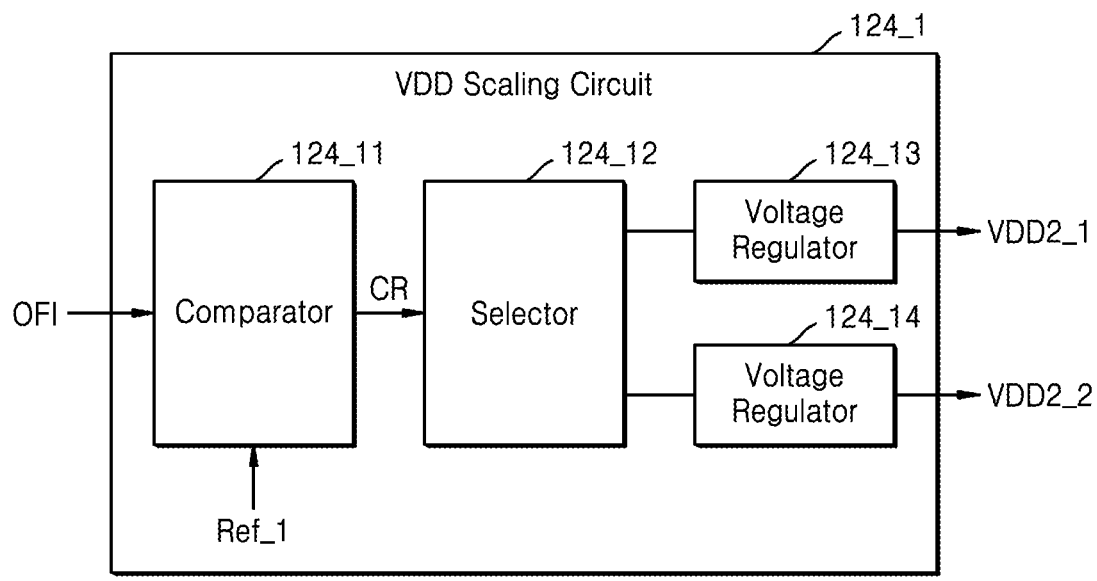

FIGS. 3A to 3C are diagrams for describing an operation of the DQ scaler 124 of FIG. 1, according to some embodiments of the inventive concepts.

Referring to FIG. 3A, the DQ scaler 124 may include a power voltage scaling circuit 124_1, and the driver 126 may include first and second driving circuits 126_1 and 126_2. The power voltage scaling circuit 124_1 according to some embodiments may receive a first power voltage VDD1 and operating frequency information OFI, and may scale the first power voltage VDD1 into a second power voltage VDD2 based on the operating frequency information OFI. As described above, the operating frequency information OFI may indicate the operating frequency condition of the memory device. The second power voltage VDD2 may be scaled to have one of at least two levels and may be provided to the first and second driving circuits 126_1 and 126_2.

The first driving circuit 126_1 may include a first pull-up circuit 126_11, to which the second power voltage VDD2 is directly provided, and a first pull-down circuit 126_12 that is grounded, and the second driving circuit 126_2 may include a second pull-up circuit 126_21, to which the second power voltage VDD2 is directly provided, and a second pull-down circuit 126_22 that is grounded. The DQ signal DQ may be output from a node to which the first pull-up circuit 126_11 and the first pull-down circuit 126_12 are connected, and from a node to which the second pull-up circuit 126_21 and the second pull-down circuit 126_22 are connected. A detailed structure of the driver 126 is described herein with reference to FIG. 6.

Referring to FIG. 3B, the power voltage scaling circuit 124_1 may include a comparator 124_11, a selector 124_12, and first and second voltage regulators 124_13 and 124_14.

As an example, the first and second voltage regulators 124_13 and 124_14 may be implemented as LowDropOut (LDO) regulators. The comparator 124_11 may receive the operating frequency information OFI and may compare the operating frequency information OFI with a first reference value Ref_1. The comparator 124_11 may generate a comparison result signal CR and may provide the comparison result signal CR to the selector 124_12. The selector 124_12 may select one of the first and second voltage regulators 124_13 and 124_14 based on the comparison result signal CR to generate one of the second power voltages VDD2_1 and VDD2_2. The first and second voltage regulators 124_13 and 124_14 may respectively generate the second power voltages VDD2_1 and VDD2_2 having different levels by receiving the first power voltage VDD1. As an example, the first power regulator 124_13 may generate the second power voltage VDD2_1 having a higher level than the second power voltage VDD2_2 generated by the second voltage regulator 124_14. In this example, the first voltage regulator 124_13 may be selected under a relatively high operating frequency condition and may output the second power voltage VDD2_1 and the second voltage regulator 124_14 may be selected under a relatively low operating frequency condition and output the second power voltage VDD2_2.

In addition, as described above, the operating frequency condition may be sub-divided and the levels of the second power voltage may be diversified. For example, the power voltage scaling circuit 124_1 may include a comparator 124_11 that compares a greater number of first reference values with the operating frequency information OFI, and the power voltage scaling circuit 124_1 may a greater number of voltage regulators than shown in FIG. 3B.

FIG. 3C is a table illustrating a scaling method of the second power voltage level VDD level provided to the driver 126 (see FIG. 3A) under various operating frequency conditions. Referring to a first table TB_1, the operating frequency conditions may be classified as first to j-th ranges RG_1 to RG_j according to operating frequency values, and the second power voltage levels (VDD levels) corresponding to the first to j-th ranges RG_1 to RG_j may correspond to first to j-th power voltage levels VDD_LV_1 to VDD_LV_j.

For example, the power voltage scaling circuit 124_1 scales the first power voltage VDD1 to the second power voltage VDD2 having the first power voltage level VDD_LV_1 when the operating frequency condition of the operating frequency information OFI matches the first range RG_1 and provides the second power voltage VDD2 having the first power voltage level VDD_LV_1 to the first and second driving circuits 126_1 and 126_2. The power voltage scaling circuit 124_1 scales the first power voltage VDD1 to the second power voltage VDD2 having the second power voltage level VDD_LV_2 when the operating frequency condition of the operating frequency information OFI matches the first range RG_2 and provides the second power voltage VDD2 having the first power voltage level VDD_LV_2 to the first and second driving circuits 126_1 and 126_2.

Figure 4A:
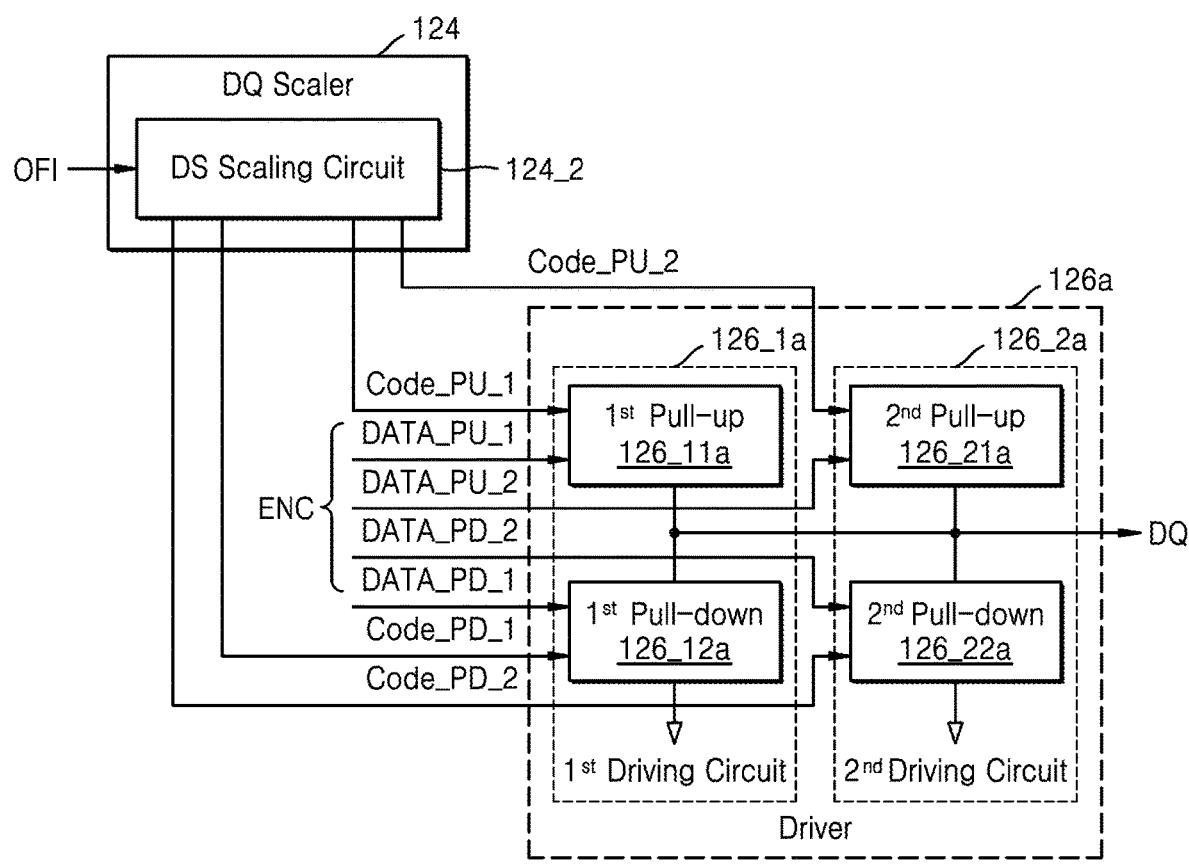
FIGS. 4A to 4C are diagrams for describing an operation of the DQ scaler of FIG. 1, according to some embodiments of the inventive concepts.
Figures 4B, 4C:
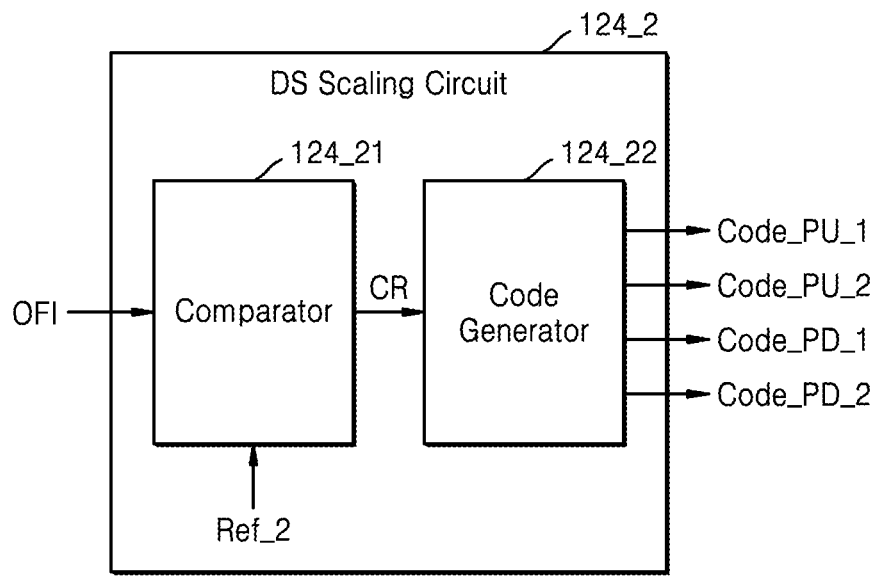

FIGS. 4A to 4C are diagrams illustrating an operation of the DQ scaler 124 of FIG. 1, according to some embodiments of the inventive concepts.

Referring to FIG. 4A, the DQ scaler 124 may include a driving strength scaling circuit 124_2, and a driver 126a may include first and second driving circuits 126_1a and 126_2a. The driving strength scaling circuit 124_2 according to some embodiments may receive the operating frequency information OFI and may scale the driving strength of the driver 126a based on the operating frequency information OFI. In greater detail, the driving strength scaling circuit 124_2 may generate first to fourth code signals Code_PU_1, Code_PD_1, Code_PU_2, and Code_PD_2 based on the operating frequency information OFI. For example, the first code signal Code_PU_1 may be provided to a first pull-up circuit 126_11a for scaling the driving strength of the first pull-up circuit 126_11a, the second code signal Code_PD_1 may be provided to a first pull-down circuit 126_12a for scaling the driving strength of the first pull-down circuit 126_12a, the third code signal Code_PU_2 may be provided to a second pull-up circuit 126_21a for scaling the driving strength of the second pull-up circuit 126_21a, and the fourth code signal Code_PD_2 may be provided to a second pull-down circuit 126_22a for scaling the driving strength of the second pull-down circuit 126_22a.

For example, the first to fourth code signals Code_PU_1, Code_PD_1, Code_PU_2, and Code_PD_2 may include a number of bits for controlling the turning-on/off of scaling transistors included respectively in the first pull-up circuit 126_11a, the first pull-down circuit 126_12a, the second pull-up circuit 126_21a, and the second pull-down circuit 126_22a. The number of bits in the code signal may match the number of scaling transistors included in the pull-up circuit or the pull-down circuit. This is described later with reference to FIG. 6. A scaling transistor may be defined as a transistor that is turned on/turned off for scaling the driving strength of the pull-up circuit or the pull-down circuit.

In addition, the first pull-up circuit 126_11a, the first pull-down circuit 126_12a, the second pull-up circuit 126_21a, and the second pull-down circuit 126_22a may respectively receive first to fourth data signals DATA_PU_1, DATA_PD_1, DATA_PU_2, and DATA_PD_2. The first to fourth data signals DATA_PU_1, DATA_PD_1, DATA_PU_2, and DATA_PD_2 may be included in the encoding data ENC output from the PAM encoder 122 of FIG. 1. In some embodiments, the first to fourth data signals DATA_PU_1, DATA_PD_1, DATA_PU_2, and DATA_PD_2 may each have one bit.

In some embodiments, under the relatively high operating frequency condition, the driving strength may be increased by increasing the number of turned-on scaling transistors from among the scaling transistors included in the first pull-up circuit 126_11a, the first pull-down circuit 126_12a, the second pull-up circuit 126_21a, and the second pull-down circuit 126_22a. Also, under the relatively low operating frequency condition, the driving strength may be reduced by reducing the number of turned-on scaling transistors from among the scaling transistors included in the first pull-up circuit 126_11a, the first pull-down circuit 126_12a, the second pull-up circuit 126_21a, and the second pull-down circuit 126_22a. Through the above controlling operation, the transition slope between the adjacent levels in the DQ signal DQ may be scaled according to the operating frequency condition.

Further referring to FIG. 4B, the driving strength scaling circuit 124_2 may include a comparator 124_21 and a code generator 124_22. The comparator 124_21 may receive the operating frequency information OFI and may compare the operating frequency information OFI with a second reference value Ref_2. The comparator 124_21 may generate a comparison result signal CR and may provide the comparison result signal CR to the code generator 124_22. The comparator 124_21 may generate the first to fourth code signals Code_PU_1, Code_PD_1, Code_PU_2, and Code_PD_2 based on the comparison result signal CR.

In addition, as described above, the operating frequency condition may be sub-divided and the values that the code signal may have may be diversified, and the driving strength scaling circuit 124_2 may include a comparator 124_21 that compares more than one second reference values with the operating frequency information OFI and the code generator 124_22 for generating code signals, such as first to fourth code signals Code_PU_1, Code_PD_1, Code_PU_2, and Code_PD_2, having various values.

FIG. 4C is a table for illustrating a scaling method of the driving strength of the driver 126 (see FIG. 4A) under various operating frequency conditions. Referring to a second table TB_2, the operating frequency conditions may be classified as first to k-th ranges RG_1 to RG_k according to the operating frequency value, and the driving strengths corresponding to the first to k-th ranges RG_1 to RG_k may correspond to first to k-th strengths DS_1 to DS_k. For convenience of description, the strengths are abstractly expressed as the first to k-th strengths DS_1 to DS_k in the second table TB_2, but this is merely one example, and they instead may be expressed as the number of scaling transistors that are turned on (or turned off). In addition, the code generator 124_22 may generate code signals, such as the first to fourth code signals Code_PU_1, Code_PD_1, Code_PU_2, and Code_PD_2, based on the second table TB_2.

Figures 5A, 5B:
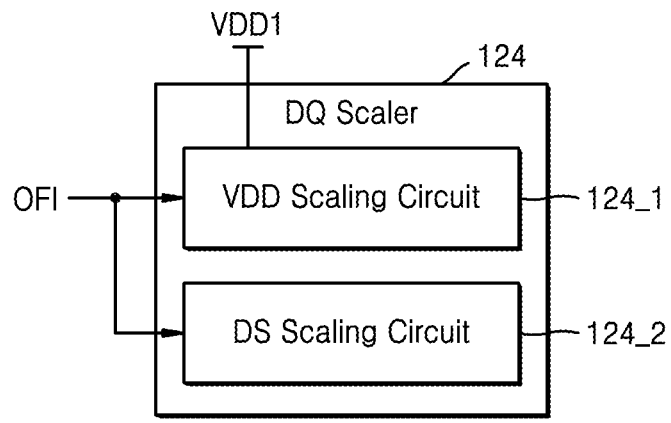
FIGS. 5A to 5C are diagrams for describing an operation of the DQ scaler of FIG. 1, according to some embodiments of the inventive concepts.
Figure 5C:
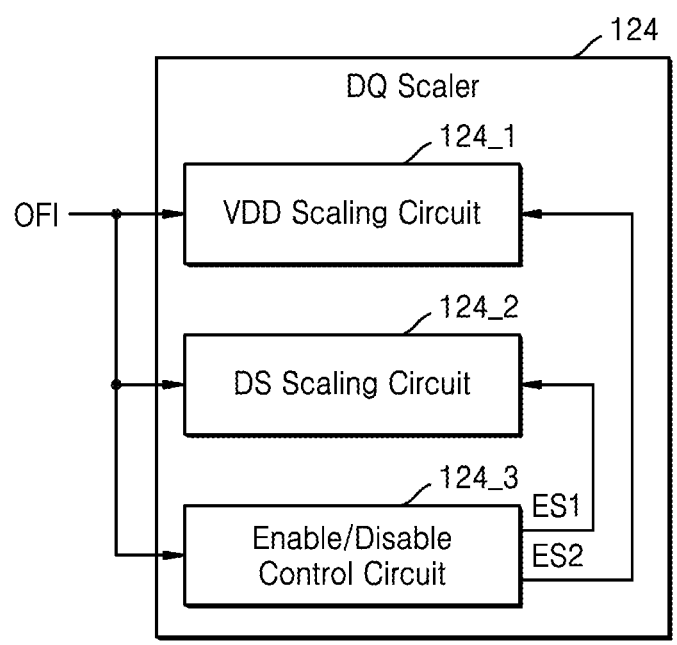

FIGS. 5A to 5C are diagrams illustrating an operation of the DQ scaler 124 of FIG. 1, according to some embodiments of the inventive concepts.

Referring to FIG. 5A, the DQ scaler 124 may include the power voltage scaling circuit 124_1 and the driving strength scaling circuit 124_2. In some embodiments, the power voltage scaling circuit 124_1 and the driving strength scaling circuit 124_2 respectively receive the operating frequency information OFI and may simultaneously scale the power voltage provided to the driver and the driving strength of the driver based on the operating frequency information OFI.

FIG. 5B is a table for describing a scaling method of a level of the second power voltage (VDD level) provided to the driver 126 (see FIG. 1) and the driving strength of the driver 126 (see FIG. 1) under various operating frequency conditions. Referring to a third table TB_3, the operating frequency conditions may be classified as first to f-th ranges RG_1 to RG_f according to operating frequency values, and the second power voltage levels (VDD levels) corresponding to the first to f-th ranges RG_1 to RG_f may correspond to first to f-th power voltage levels VDD_LV_1 to VDD_LV_f. The driving strengths corresponding to the first to f-th ranges RG_1 to RG_f may correspond to the first to f-th strengths DS_1 to DS_f.

Referring to FIG. 5C, the DQ scaler 124 may further include an enable/disable control circuit 124_3 as compared with the DQ scaler 124 of FIG. 5A. In some embodiments, the enable/disable control circuit 124_3 may receive the operating frequency information OFI, may generate first and second enable/disable signals ES1 and ES2 based on the operating frequency information OFI, and then may provide the first and second enable/disable signals ES1 and ES2 to the power voltage scaling circuit 124_1 and the driving strength scaling circuit 124_2. That is, at least one of the power voltage scaling circuit 124_1 and the driving strength scaling circuit 124_2 may be selectively enabled or disabled, according to the operating frequency information OFI of the memory device.

Accordingly, in the DQ scaler 124 of FIG. 5C, the interval between the adjacent levels of the DQ signal, and the transition slope between the adjacent levels of the DQ signal, may be independently or complementarily scaled from each other through the configuration of the enable/disable control circuit 124_3.

Figure 6:
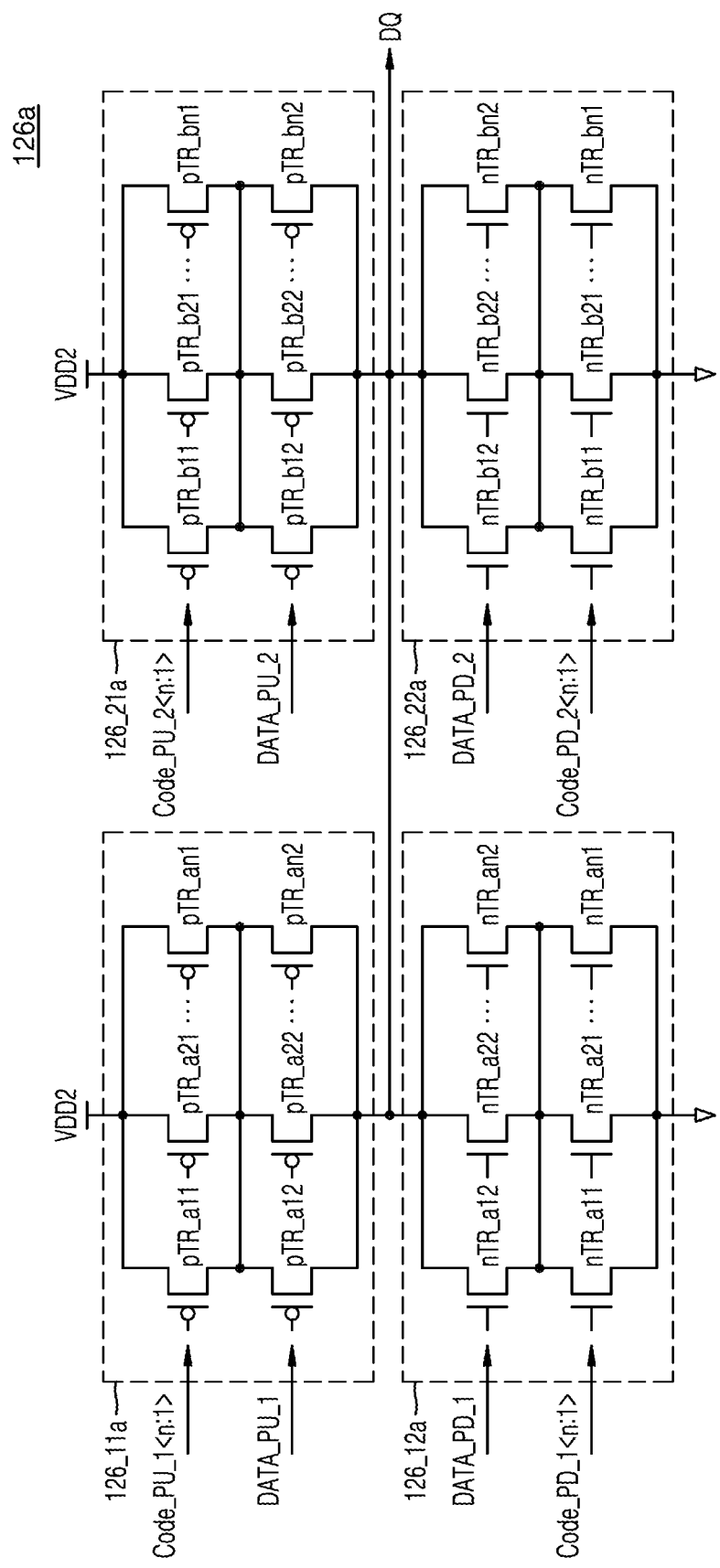
FIG. 6 is a circuit diagram of a driver according to some embodiments of the inventive concepts.

FIG. 6 is a circuit diagram of a driver 126a according to some embodiments of the inventive concepts. However, the present disclosure is not limited to the example of the driver 126a in FIG. 6, and it may be understood that pull-up circuits 126_11a and 126_21a and pull-down circuits 126_12a and 126_22a may be configured by various combinations of transistors so as to support the operations according to the inventive concepts.

Referring to FIG. 6, the driver 126a may include the first pull-up circuit 126_11a, the first pull-down circuit 126_12a, the second pull-up circuit 126_21a, and the second pull-down circuit 126_22a. The first pull-up circuit 126_11a may include first to n-th pMOS scaling transistors pTR_a11 to pTR_an1 and first to n-th pMOS transistors pTR_a12 to pTR_an2. The first pull-down circuit 126_12a may include first to n-th nMOS scaling transistors nTR_a11 to nTR_an1 and first to n-th nMOS transistors nTR_a12 to nTR_an2. The second pull-up circuit 126_21a may include n+1st to 2n-th pMOS scaling transistors pTR_b11 to pTR_bn1 and n+1st to 2n-th pMOS transistors pTR_b12 to pTR_bn2. The second pull-down circuit 126_22a may include n+1st to 2n-th nMOS scaling transistors nTR_b11 to nTR_bn1 and n+1st to 2n-th nMOS transistors nTR_b12 to nTR_bn2.

In some embodiments, the first pull-up circuit 126_11a and the first pull-down circuit 126_12a in the driver 126a configured to output the DQ signal DQ based on PAM4 may receive first and second data signals Data_PU_1 and Data_PD_1 corresponding to a most significant bit (MSB), and the second pull-up circuit 126_21a and the second pull-down circuit 126_22a may respectively receive third and fourth data signals Data_PU_1 and Data_PD_2 corresponding to a least significant bit (LSB). The transistors included in the first pull-up circuit 126_11a and the first pull-down circuit 126_12a may have characteristics that more current may flow under the same condition as compared with the transistors included in the second pull-up circuit 126_21a and the second pull-down circuit 126_22a. For example, the transistors included in the first pull-up circuit 126_11a and the first pull-down circuit 126_12a may have greater channel widths or sizes than those of the transistors included in the second pull-up circuit 126_21a and the second pull-down circuit 126_22a.

In some embodiments, the first to n-th pMOS scaling transistors pTR_a11 to pTR_an1 of the first pull-up circuit 126_11a may receive a first code signal Code_PU_1<n:1> via a gate terminal and may receive the second power voltage VDD2 via a source terminal, and the first to n-th pMOS transistors pTR_a12 to pTR_an2 may receive the first data signal Data_PU_1 via a gate terminal. A drain terminal in each of the first to n-th pMOS scaling transistors pTR_a11 to pTR_an1 may be connected to a drain terminal in each of the first to n-th pMOS transistors pTR_a12 to pTR_an2.

In some embodiments, the first to n-th nMOS scaling transistors nTR_a11 to nTR_an1 of the first pull-down circuit 126_12a may receive a second code signal Code_PD_1 <n:1> via a gate terminal and may be grounded via a source terminal, and the first to n-th nMOS transistors nTR_a12 to nTR_an2 may receive the second data signal Data_PD_1 via a gate terminal. A drain terminal in each of the first to n-th nMOS scaling transistors nTR_a11 to nTR_an1 may be connected to a drain terminal in each of the first to n-th nMOS transistors nTR_a12 to nTR_an2.

In some embodiments, the n+1st to 2n-th pMOS scaling transistors pTR_b11 to pTR_bn1 of the second pull-up circuit 126_21a may receive a third code signal Code_PU_2 <n:1> via a gate terminal and may receive the second power voltage VDD2 via a source terminal, and the n+1st to 2n-th pMOS transistors pTR_b12 to pTR_bn2 may receive the third data signal Data_PU_2 via a gate terminal. A drain terminal in each of the n+1st to 2n-th pMOS scaling transistors pTR_b11 to pTR_bn1 may be connected to a drain terminal in each of the n+1st to 2n-th pMOS transistors pTR_b12 to pTR_bn2.

In some embodiments, the n+1st to 2n-th nMOS scaling transistors nTR_b11 to nTR_bn1 of the second pull-down circuit 126_22a may receive a fourth code signal Code_PD_2 <n:1> via a gate terminal and may be grounded via a source terminal, and the n+1st to 2n-th nMOS transistors nTR_b12 to nTR_bn2 may receive the fourth data signal Data_PD_2 via a gate terminal. A drain terminal in each of the n+1st to 2n-th nMOS scaling transistors nTR_b11 to nTR_bn1 may be connected to a drain terminal in each of the n+1st to 2n-th nMOS transistors nTR_b12 to nTR_bn2.

As described above, the driver 126a may receive the second power voltage VDD2 that varies depending on the operating frequency condition, and then may output the DQ signal DQ in which the interval between the adjacent levels is scaled. Also, the driver 126a may output the DQ signal DQ in which the transition slope between the adjacent levels is scaled by receiving the first to fourth code signals Code_PU_1<n:1>, Code_PD_1<n:1>, Code_PU_2<n:1>, and Code_PU_2<n:1> that may control the number of scaling transistors that are turned on according to the operating frequency condition.

However, although the driver 126a shown in FIG. 6 is an example circuit diagram for generating the DQ signal DQ based on PAM4, the present disclosure is not limited thereto. That is, the driver 126a may be implemented via various circuit diagrams, and as such, may be implemented by a circuit diagram by which the DQ signal DQ based on PAMn may be scaled and output according to one or more embodiments of the inventive concepts.

Figure 7A:
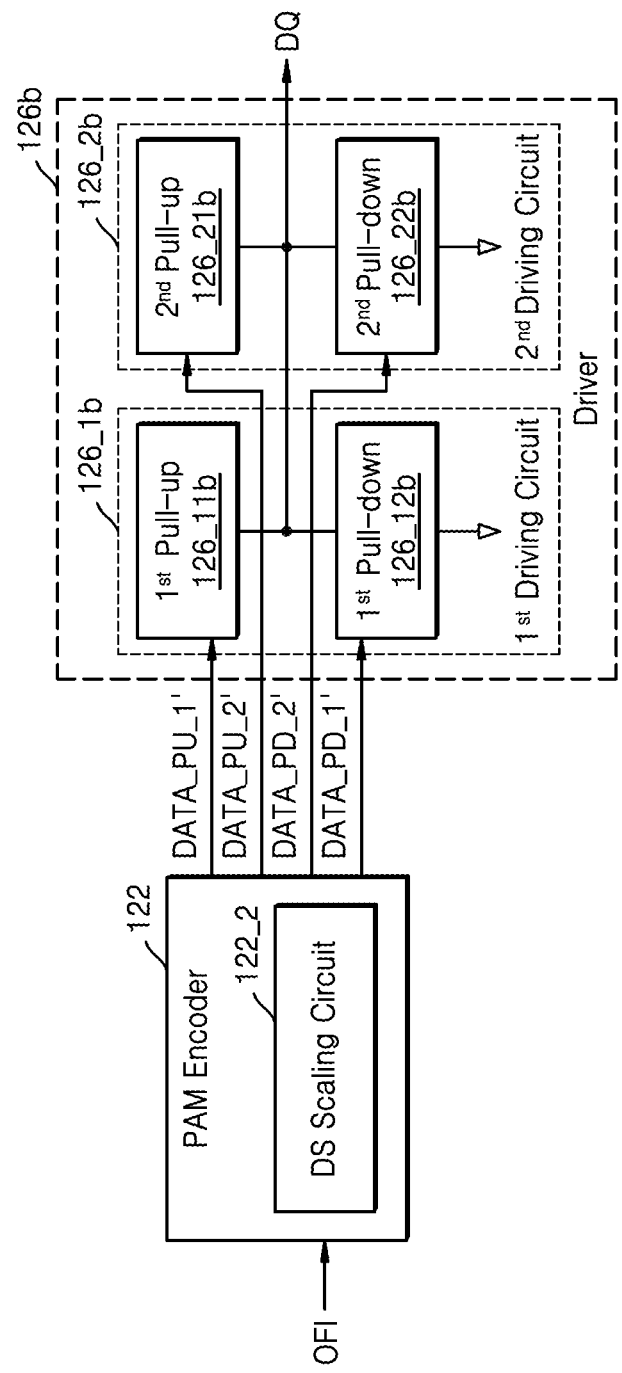
FIGS. 7A and 7B are diagrams for describing an operation of a PAM encoder including a driving strength scaling circuit.
Figure 7B:
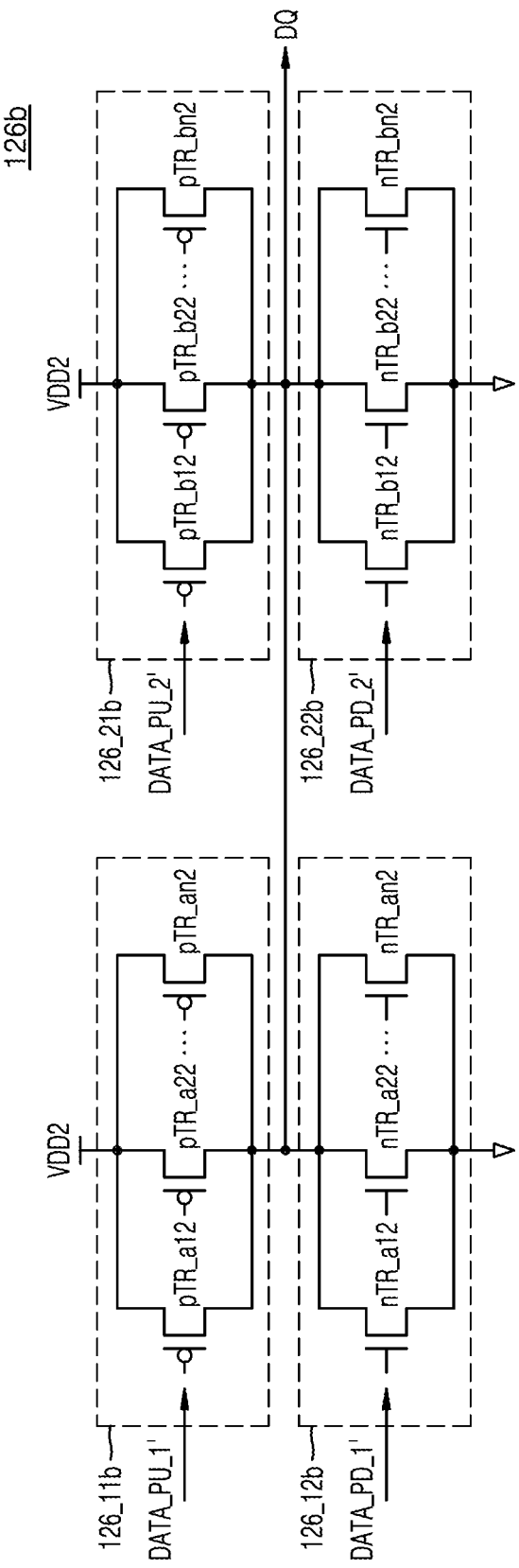

FIGS. 7A and 7B are diagrams illustrating an operation of a PAM encoder 122 including a driving strength scaling circuit 122_2. However, the present disclosure is not limited to the example driver 126b illustrated in FIG. 7B, and it may be understood that the pull-up circuits 126_11b and 126_21b and pull-down circuits 126_12b and 126_22b may be configured by various combinations of transistors so as to support the operations according to the inventive concepts. Hereinafter, descriptions that are provided above with reference to FIG. 6 are omitted.

Referring to FIG. 7A, the PAM encoder 122 may include the driving strength scaling circuit 122_2. The PAM encoder 122 including the driving strength scaling circuit 122_2 according to some embodiments of the inventive concepts may receive the operating frequency information OFI and may generate first to fourth data signals Data_PU_1', DATA_PD_1', DATA_PU_2', and DATA_PD_2' based on the operating frequency information OFI. The first to fourth data signals Data_PU_1', DATA_PD_1', DATA_PU_2', and DATA_PD_2' may be implemented to scale the driving strength of the driver 126b and at the same time generate the DQ signal DQ.

Referring to FIG. 7B, the driver 126b may include the first pull-up circuit 126_11b, the first pull-down circuit 126_12b, the second pull-up circuit 126_21b, and the second pull-down circuit 126_22b. The first pull-up circuit 126_11b may include first to n-th pMOS transistors pTR_a12 to pTR_an2. The first pull-down circuit 126_12b may include first to n-th nMOS transistors nTR_a12 to nTR_an2. The second pull-up circuit 126_21b may include n+1st to 2n-th pMOS transistors pTR_b12 to pTR_bn2. The second pull-down circuit 126_22b may include n+1st to 2n-th nMOS transistors nTR_b12 to nTR_bn2.

The number of activated transistors and the number of deactivated transistors from among the transistors included in each of the first pull-up circuit 126_11b, the first pull-down circuit 126_12b, the second pull-up circuit 126_21b, and the second pull-down circuit 126_22b may be adjusted through the first to fourth data signals Data_PU_1', DATA_PD_1', DATA_PU_2', and DATA_PD_2' according to the driving strength that corresponds to and/or is suitable for the operating frequency information OFI. For example, in order to increase the driving strength of the first pull-up circuit 126_11b, the number of activated transistors in the first to n-th pMOS transistors pTR_a12 to pTR_an2 through the first data signal DATA_PU_1' may be increased.

Through the above method, the driver 126b may not need to include scaling transistors for scaling the driving strength, and accordingly, the circuit size and the power consumption of the driver 126b may be reduced.

Figure 8:
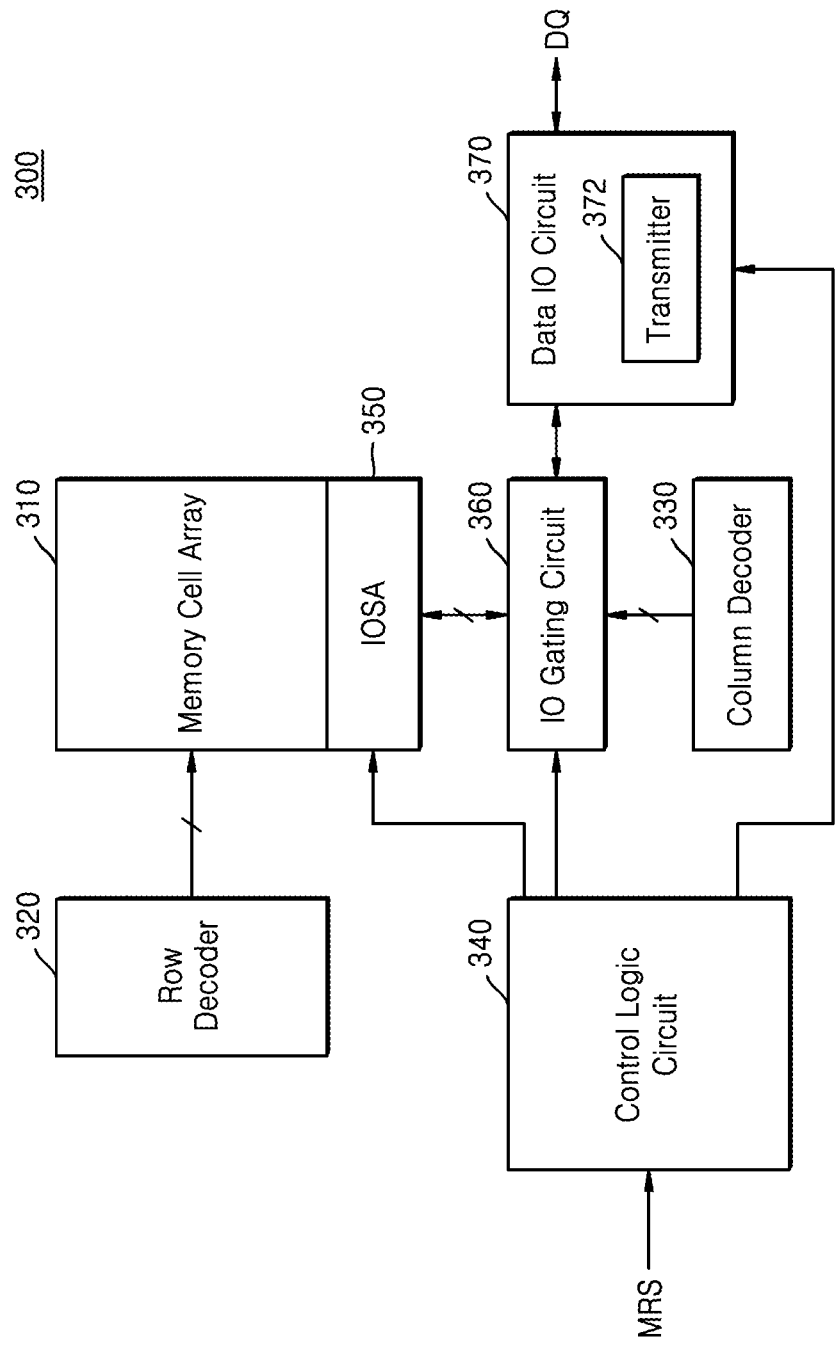
FIG. 8 is a block diagram of a memory device according to some embodiments of the inventive concepts.

FIG. 8 is a block diagram of a memory device 300 according to some embodiments of the inventive concepts.

Referring to FIG. 8, the memory device 300 may include a memory cell array 310, a row decoder 320, a column decoder 330, a control logic circuit 340, an input/output sense amplifier (IOSA) 350, an input/output (IO) gating circuit 360, and a data input/output circuit 370.

The memory cell array 310 may include memory cells connected to a plurality of word lines and a plurality of bit lines, and the row decoder 320 may perform an operation of selecting the word lines in response to a row address from outside. Also, the column decoder 330 may perform an operation of selecting the bit lines in response to a column address from outside.

The control logic circuit 340 may control overall operations in the memory device 300. For example, the control logic circuit 340 may control various circuit blocks in the memory device 300 in response to a command from a memory controller (not shown). As an example, the control logic circuit 340 may provide program data included in the DQ signal DQ to the memory cell array 310 by controlling the data input/output circuit 370, the input/output gating circuit 360, and the input/output sense amplifier 350 during a data programming operation.

The DQ signal DQ including the program data according to some embodiments may be received from the memory controller and may be scaled in the memory controller with the DQ parameter corresponding to and/or suitable for the operating frequency condition. For example, in the DQ signal DQ transmitted from the memory controller, at least one of the interval between the adjacent levels and the transition slope between the adjacent levels may be scaled by the memory controller according to the operating frequency condition of the memory controller. That is, the DQ signals DQ transmitted from the memory controller under different operating frequency conditions may each have the interval between the adjacent levels and the transition slope between the adjacent levels, at least one of which is different from those of the others.

Also, in some embodiments, during a data reading operation, the control logic circuit 340 may provide the DQ signal DQ including the read data to the memory controller by controlling the input/output sense amplifier 350, the input/output gating circuit 360, and the data input/output circuit 370. The data input/output circuit 370 may include a transmitter 372 according to some embodiments of the inventive concepts, and the transmitter 372 may scale the DQ signal DQ to be corresponding to and/or suitable for the operating frequency condition according to the above-described embodiments.

In some embodiments, the memory device 300 may obtain the operating frequency information from a mode register set (MRS) signal MRS transmitted from the memory controller. For example, the operating frequency information may include information regarding the operating frequency of the memory device, e.g., CAS latency, write recovery time, etc. The memory device 300 may determine its operating frequency condition based on the operating frequency information.

Figure 9A:
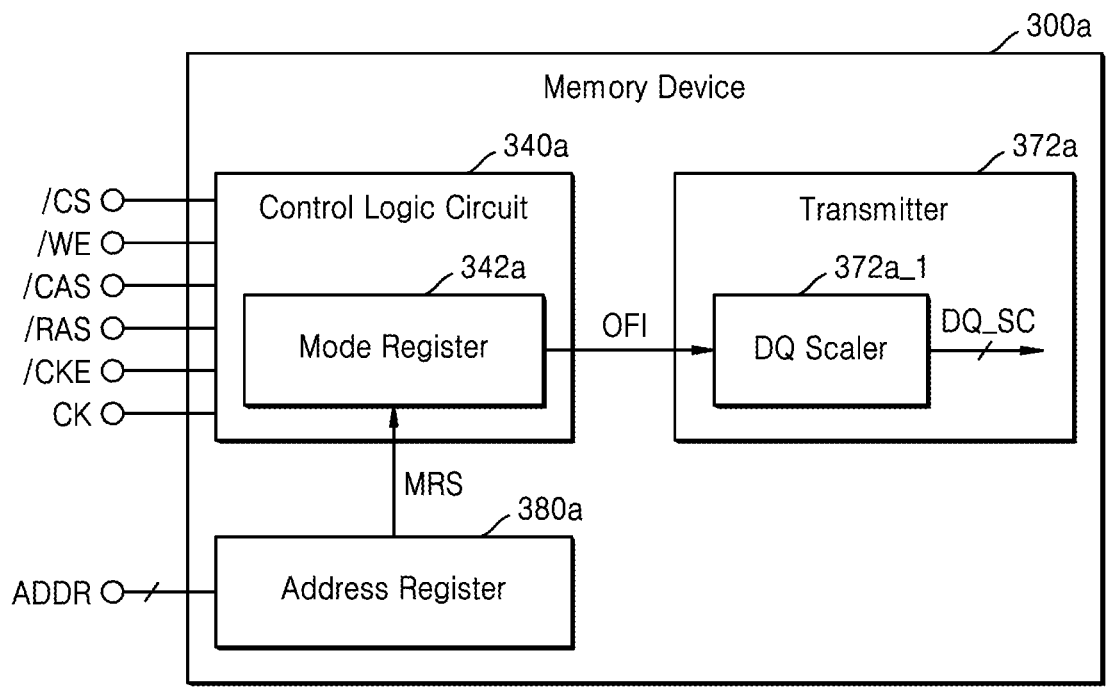
FIGS. 9A and 9B are block diagrams showing examples of a memory device according to some embodiments of the inventive concepts.
Figure 9B:
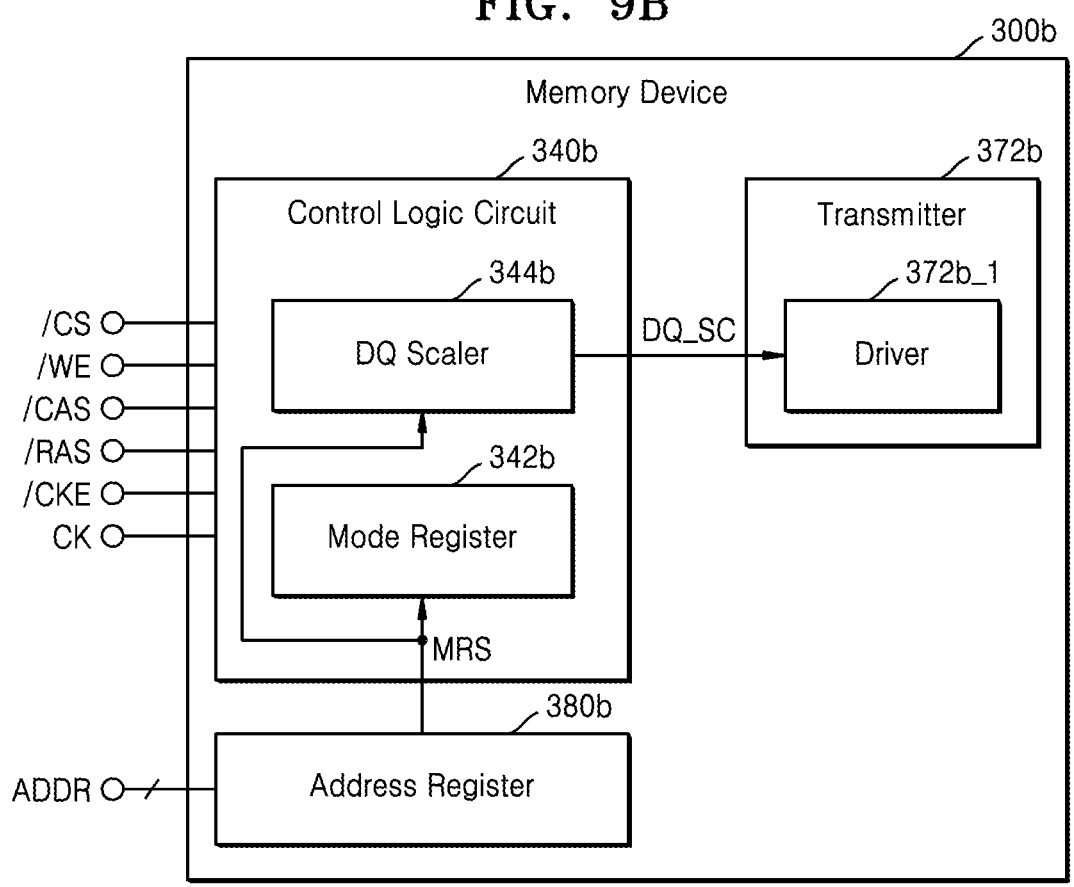

FIGS. 9A and 9B are block diagrams showing examples of memory devices 300a and 300b according to some embodiments of the inventive concepts.

Referring to FIG. 9A, the memory device 300a may include a control logic circuit 340a, a transmitter 372a, and an address register 380a. The control logic circuit 340a may include a mode register 342a. The control logic circuit 340a may receive signals related to the command applied from the memory controller, e.g., a chip select (/CS) signal, a row address strobe (/RAS) signal, a column address strobe (/CAS) signal, a write enable (/WE) signal, a clock enable (/CKE) signal, etc., and may decode the signals and internally generate a decoded command.

The address register 380a may receive an address signal ADDR via a plurality of address pads of the memory device 300a and may synchronize the address signal ADDR with a main clock signal CK or an inverted clock signal and provide the address signal ADDR to the control logic circuit 340a. In addition, in some embodiments, the address register 380a may receive the MRS signal MRS via the address pads and may provide the MRS signal MRS to the mode register 342a. The MRS signal MRS may be a signal that designates an operating mode of the mode register 342a and may include the operating frequency information OFI of the memory device 300a.

For example, the transmitter 372a may include a DQ scaler 372a_1, and the mode register 342a may provide the operating frequency information OFI to the DQ scaler 372a_1. The DQ scaler 372a_1 may generate a DQ scaling signal DQ_SC for scaling the DQ signal based on the operating frequency information OFI. Detailed operations of the DQ scaler 372a_1 are described above, and thus, redundant descriptions thereof are not provided here in the interest of brevity.

In addition, the example of FIG. 9A is an example embodiment, and thus, the present disclosure is not limited thereto. In addition, in some embodiments, the address register 380a may directly provide the MRS signal MRS to the DQ scaler 372a_1.

Referring to FIG. 9B, a control logic circuit 340b may further include a DQ scaler 344b as compared with the example of FIG. 9A. The DQ scaler 344b may receive the MRS signal MRS from the address register 380b and may obtain the operating frequency information from the MRS signal MRS. The DQ scaler 344b may generate a DQ scaling signal DQ_CS for scaling the DQ signal based on the operating frequency information and may provide the DQ scaling signal DQ_CS to a driver 372b_1 included in a transmitter 372b. The driver 372b_1 may output the DQ signal that is scaled with the DQ parameter corresponding to and/or suitable for the operating frequency information in response to the DQ scaling signal DQ_CS.

FIGS. 10 to 13 are flowcharts of methods of operating a memory device, according to some embodiments of the inventive concepts. The embodiments described below may be applied to a memory controller, and the DQ signal scaled by the memory controller may be output to a memory device or a host.

Figure 10:
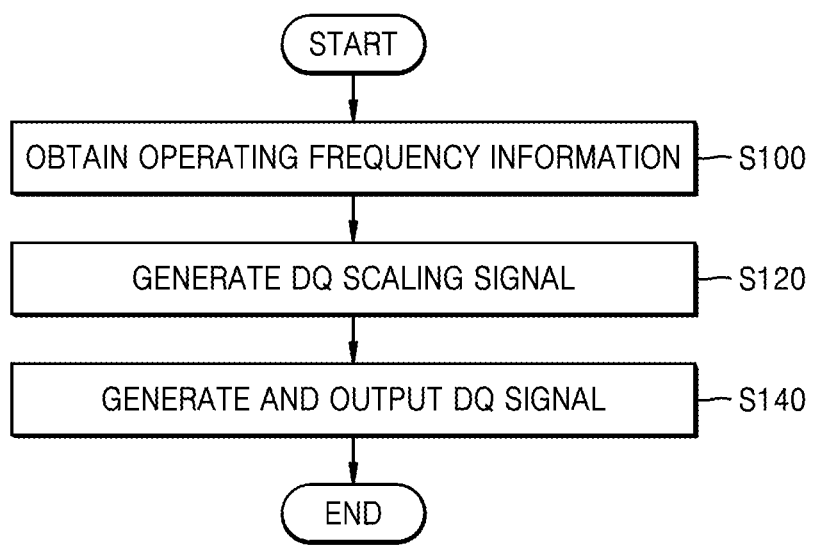
FIGS. 10 to 13 are flowcharts of a method of operating a memory device, according to some embodiments of the inventive concepts.
Figure 11:
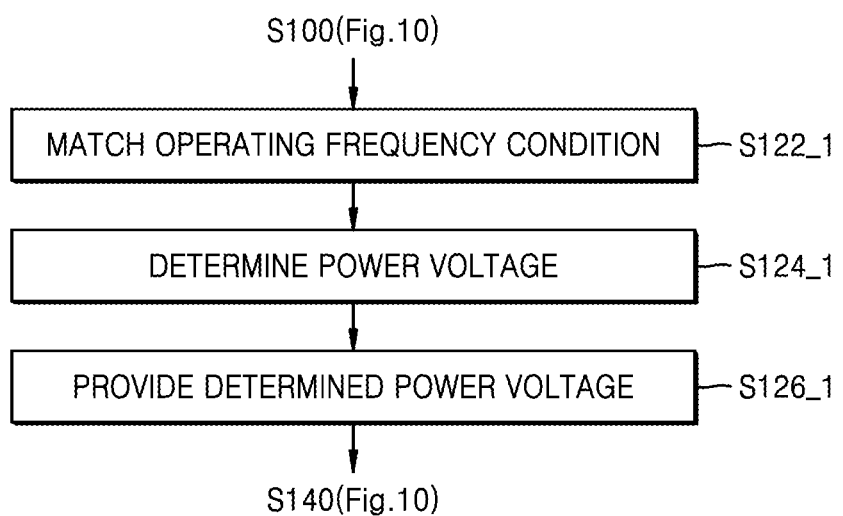

Referring to FIG. 10, a memory device may obtain operating frequency information in operation S100. The operating frequency information may indicate the operating frequency condition of the memory device, and the memory device may determine the operating frequency of the memory device from the operating frequency information. In operation S120, the memory device may generate a DQ scaling signal corresponding to and/or suitable for the operating frequency condition. The DQ scaling signal may be provided to scale at least one of the interval between the adjacent levels and the transition slope of the adjacent levels of the DQ signal. In operation S140, the memory device may scale and generate the DQ signal based on PAMn according to the DQ scaling signal and may output the DQ signal to the memory controller.

In some embodiments, generating the DQ scaling signal may include one or more operations. For example, referring to FIG. 11, after operation S100, in operation S122_1, the memory device may check which operating frequency condition the current operating frequency of the memory device matches. The memory device may identify the operating frequency condition matching the operating frequency of the memory device with reference to the first table TB_1 of FIG. 3C. In operation S124_1, the memory device may determine the power voltage suitable for the operating frequency condition. In operation S124_1, the memory device may provide the determined power voltage to the driver in the memory device to scale the interval between the adjacent levels in the DQ signal. After that, operation S140 may be performed.

Figure 12:
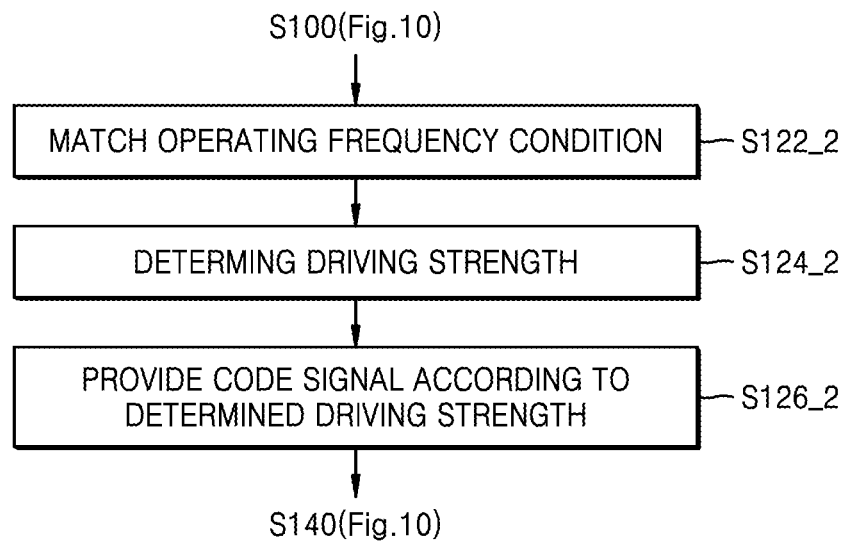

In some embodiments, and referring to FIG. 12, after operation S100, in operation S122_2, the memory device may check which operating frequency condition the current operating frequency of the memory device matches. For example, the memory device may identify the operating frequency condition matching the operating frequency of the memory device with reference to the second table TB_2 of FIG. 4C. In operation S124_2, the memory device may determine the driving strength suitable for the operating frequency condition. In operation S126_2, the memory device may provide a code signal according to the determined driving strength to the driver in the memory device to scale the transition slope between the adjacent levels of the DQ signal. After that, operation S140 may be performed.

Figure 13:
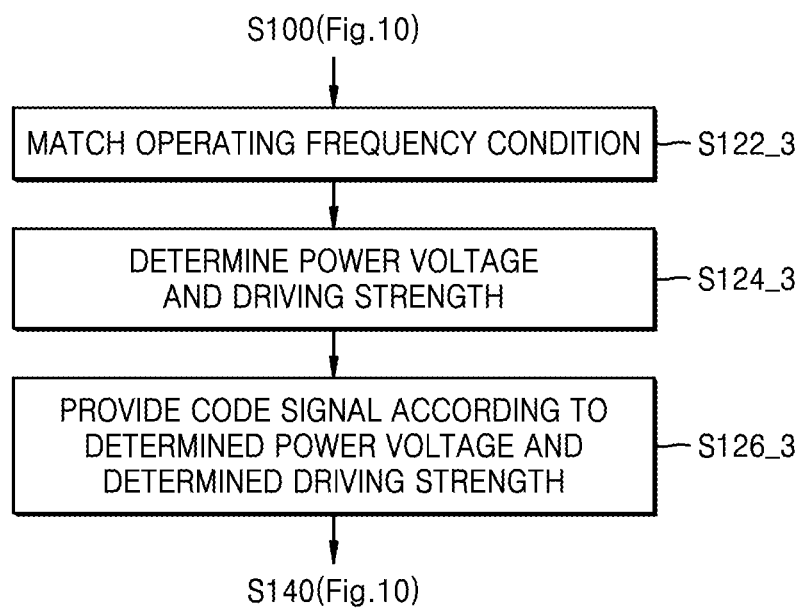

In some embodiments, and referring to FIG. 13, after operation S100, in operation S122_3, the memory device may check which operating frequency condition the current operating frequency of the memory device matches. For example, the memory device may identify the operating frequency condition matching the operating frequency of the memory device with reference to the third table TB_3 of FIG. 5C. In operation S124_3, the memory device may determine the power voltage and the driving strength suitable for the operating frequency condition. In operation S126_3, the memory device may provide a code signal according to the determined power voltage and the determined driving strength to the driver in the memory device to scale the interval between the adjacent levels and the transition slope between the adjacent levels of the DQ signal. After that, operation S140 may be performed.

Figure 14:
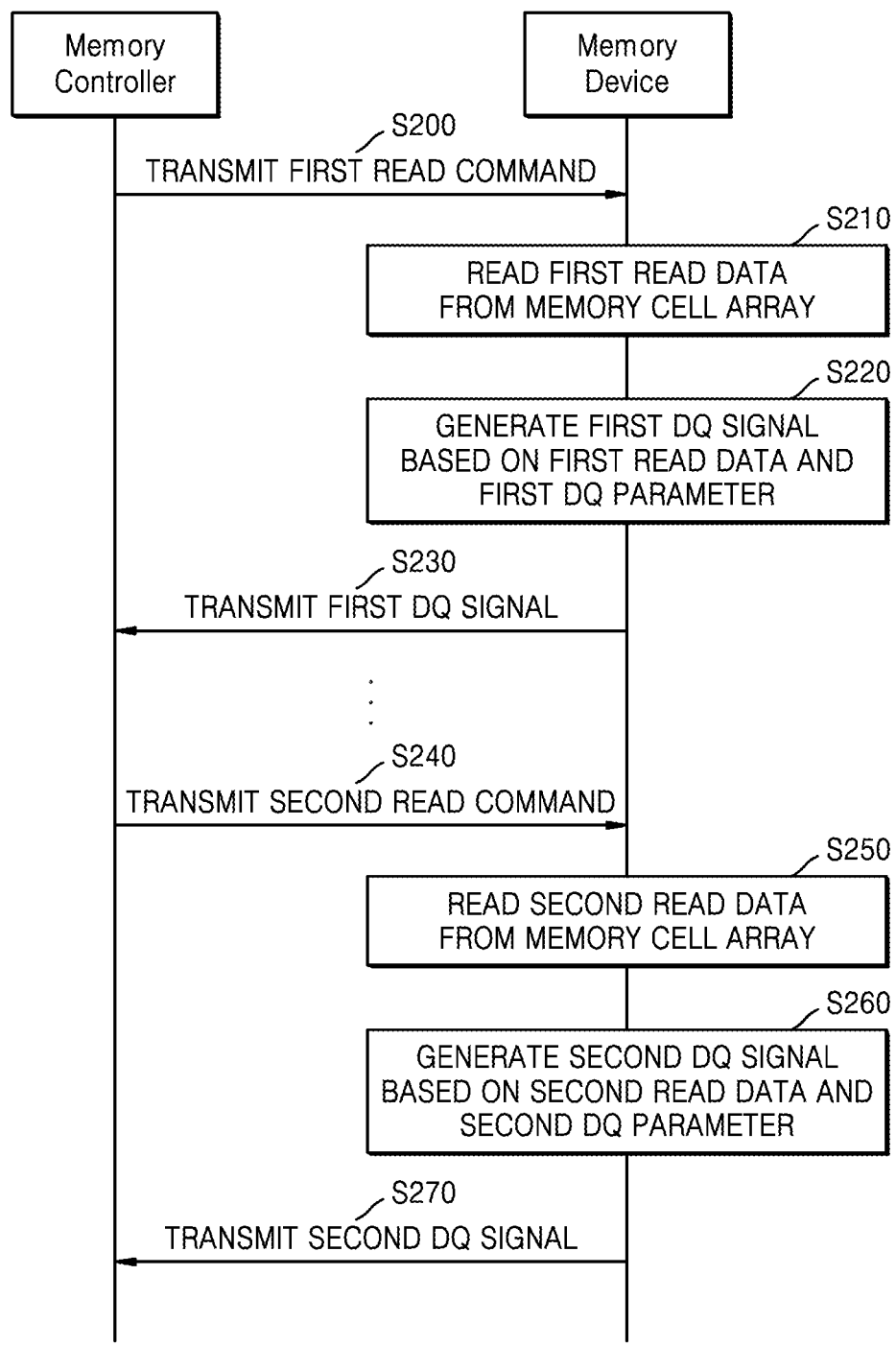
FIGS. 14 and 15 are flowcharts illustrating a method of operating a memory system, according to some embodiments of the inventive concepts.
Figure 15:
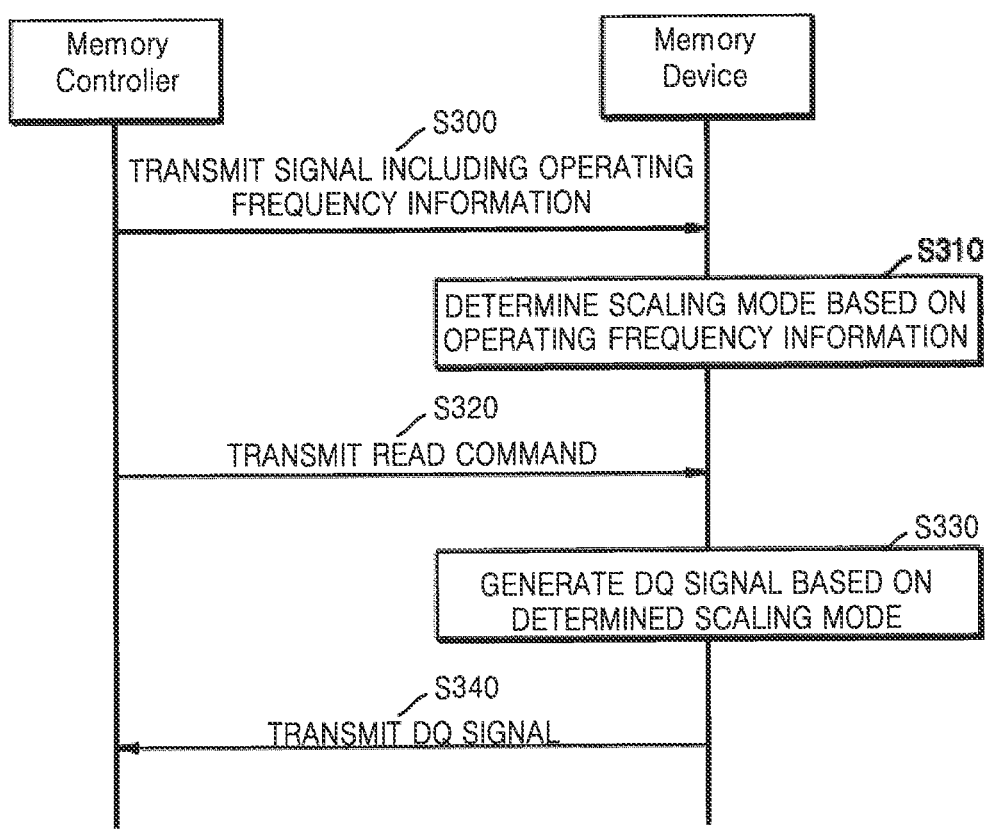

FIGS. 14 and 15 are flowcharts of methods of operating a memory system, according to some embodiments of the inventive concepts.

Referring to FIG. 14, the memory controller may transmit a first read command to the memory device in operation S200. In operation S210, the memory device may read a first read data from the memory cell array in response to the first read command. In operation S220, the first DQ signal may be generated based on the first read data and a first DQ parameter corresponding to and/or suitable for a first operating frequency condition of the memory device. The first operating frequency condition of the memory device may be transmitted from the memory controller prior to operation S200 and may be identified by the memory device. In operation S230, the memory device may transmit a first DQ signal scaled with the first DQ parameter suitable for the first operating frequency condition to the memory controller.

When a certain time period has passed after operation S230, the memory controller may transmit a second read command to the memory device in operation S240. In operation S250, the memory device may read a second read data from the memory cell array in response to the second read command. In operation S260, a second DQ signal may be generated based on the second read data and the second DQ parameter corresponding to and/or matching a second operating frequency condition of the memory device. The second operating frequency condition of the memory device may be transmitted from the memory controller prior to operation S240 and may be identified by the memory device. In operation S270, the memory device may transmit a second DQ signal scaled with the second DQ parameter suitable for the second operating frequency condition to the memory controller.

For example, when the first operating frequency condition and the second operating frequency condition are different from each other, at least one of the interval and the transition slope between adjacent levels in the first DQ signal may be different from that of the second DQ signal. For example, when the first operating frequency condition is lower than the second operating frequency condition, the interval between the adjacent levels in the DQ signal may be less than that between the adjacent levels in the second DQ signal, or the transition slope between the adjacent levels in the first DQ signal may be less steep than that between the adjacent levels in the second DQ signal.

Referring to FIG. 15, in operation S300, the memory controller may transmit a signal including operating frequency information to the memory device. In operation S310, the memory device may determine the scaling mode of the DQ signal based on the operating frequency information. The scaling mode may be set by determining in advance which one of the interval and the transition slope between adjacent levels in the DQ signal is to be scaled, and how much scaling is to be performed. In operation S320, the memory controller may transmit a command to the memory device. In operation S330, the memory device may generate the DQ signal based on the determined scaling mode. In operation S340, the memory device may provide the DQ signal to the memory controller.

Figure 16:
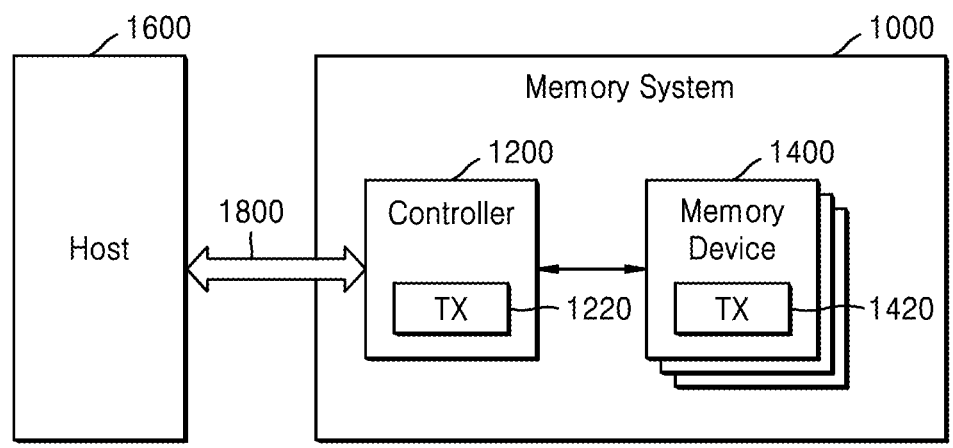
FIG. 16 is a block diagram of a system including a transmitter according to some embodiments of the inventive concepts.

FIG. 16 is a block diagram of a system including a transmitter according to some embodiments of the inventive concepts. As shown in FIG. 16, a memory system 1000 and a host system 1600 may communicate with each other via an interface 1800, and the memory system 1000 may include a memory controller 1200 and memory devices 1400.

The interface 1800 may use an electrical signal and/or an optical signal, and as non-limiting examples, the interface 1800 may be a serial advanced technology attachment (SATA) interface, a SATA express (SATAe) interface, a serial attached small computer system interface (SCSI) (SAS), a universal serial bus (USB) interface, a peripheral component interconnect bus express (PCIe) interface, or a combination thereof. The host system 1600 and the memory controller 1200 may each include a serializer/deserializer (SerDes) for serial communication.

In some embodiments, the memory system 1000 may be coupled to the host system 1600 to communicate with the host system 1600, and the coupling of the memory system 1000 to the host system 1600 may be a temporary coupling (e.g., a removable coupling) or a permanent coupling. The memory device 1400 may include a volatile memory or a non-volatile memory, and the memory system 1000 may be referred to as a storage system. For example, the memory system 1000 may be implemented, as non-limiting examples, as a solid-state drive or solid-state disk (SSD), an embedded SSD (eSSD), a multimedia card (MMC), an embedded multimedia card (eMMC), or the like. The memory controller 1200 may control the memory devices 1400 in response to a request from the host system 1600 via the interface 1800.

In addition, transmitters 1220, 1420, and 1620, to which one or more embodiments of the inventive may be applied, may be included in the memory controller 1200, the memory devices 1400, and the host system 1600, respectively. The transmitters 1220, 1420, and 1620 may be implemented with data input/output circuits.

Figure 17:
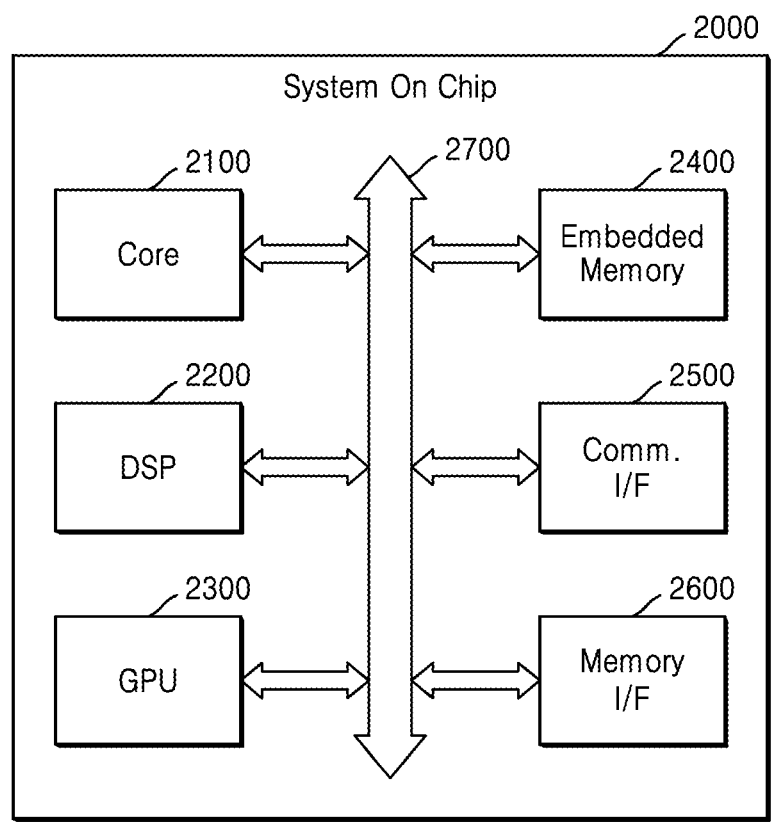
FIG. 17 is a block diagram of a system-on-chip including a memory device according to some embodiments of the inventive concepts.

FIG. 17 is a block diagram of a system-on-chip (SoC) 2000 including a memory device according to some embodiments of the inventive concepts. The SoC 2000 may denote an integrated circuit on which components of a computing system or another electronic system are integrated. For example, an application processor (AP) may be implemented as a SoC 2000, and may include a processor and components for other functions.

As shown in FIG. 17, the SoC 2000 may include a core 2100, a digital signal processor (DSP) 2200, a graphics processing unit (GPU) 2300, an embedded memory 2400, a communication interface 2500, and a memory interface 2600. The elements of the SoC 2000 may communicate with one another via a bus 2700.

The core 2100 may process instructions and may control operations of the elements in the SoC 2000. For example, the core 2100 may drive an operating system and may execute applications on the operating system by processing a series of instructions. The DSP 2200 may generate data by processing a digital signal, e.g., a digital signal provided from the communication interface 2500. The GPU 2300 may generate data for an image output through a display apparatus from image data provided from the internal memory 2400 or the memory interface 2600, and/or the GPU 2300 may encode image data. The internal memory 2400 may store data that is required for the core 2100, the DSP 2200, and the GPU 2300 to operate. The memory interface 2600 may provide an interface for a memory external to the SoC 2000, e.g., dynamic random access memory (DRAM), flash memory, or the like.

The communication interface 2500 may provide serial communication to a device and/or network located externally to the SoC 2000. For example, the communication interface 2500 may be connected to Ethernet and may include a SerDes for serial communication.

The configuration of a transmitter, to which one or more embodiments of the inventive concepts may be applied, may be included in the communication interface 2500 or the memory interface 2600. For example, a signal based on PAMn output from the communication interface 2500 or the memory interface 2600 may be scaled based on the operating frequency condition of the SoC 2000.

While the inventive concepts of the present disclosure have been particularly shown and described with reference to examples of embodiments thereof, it will be understood that various changes in form and details may be made therein without departing from the scope of the following claims.

What is claimed is:

1. A memory device comprising:
   a memory cell array; and
   a data input/output circuit configured to scale a DQ signal that includes data read from the memory cell array and output the scaled DQ signal, wherein the data input/output circuit is configured to scale the DQ signal based on an n-level pulse amplitude modulation (PAMn) with a DQ parameter that corresponds to an operating frequency condition, and wherein n is an integer greater than or equal to four.

2. The memory device of claim 1, wherein the data input/output circuit is configured to output first and second DQ signals that are scaled with different DQ parameters respectively in response to first and second read commands received under different operating frequency conditions.

3. The memory device of claim 2, wherein at least one of an interval between adjacent levels of the n levels and a transition slope between adjacent levels of the n levels in the first DQ signal is different from an interval between adjacent levels of the n levels or a transition slope between adjacent levels of the n levels of the second DQ signal.

4. The memory device of claim 2, wherein, when the first DQ signal corresponds to an operating frequency condition that is higher than an operating frequency condition corresponding to the second DQ signal, an interval between adjacent levels of the n levels in the first DQ signal is greater than an interval between adjacent levels of the n levels in the second DQ signal.

5. The memory device of claim 2, wherein, when the first DQ signal corresponds to an operating frequency condition that is higher than an operating frequency condition corresponding to the second DQ signal, a transition slope between adjacent levels of the n levels in the first DQ signal is steeper than a transition slope between adjacent levels of the n levels of the second DQ signal.

6. The memory device of claim 1, wherein the DQ parameter includes at least one of an interval between adjacent levels of the n levels and a transition slope between the adjacent levels of the n levels of the scaled DQ signal.

7. The memory device of claim 1, further comprising at least one pin configured to receive a signal that indicates the operating frequency condition from a device external to the memory device.

8. The memory device of claim 7, wherein the signal that indicates the operating frequency condition includes a mode register set (MRS) signal.

9. The memory device of claim 1, wherein the data input/output circuit comprises:
   a PAM encoder configured to generate encoding data by performing a PAMn-based encoding operation on the read data;
   a DQ parameter scaler configured to generate a DQ scaling signal based on the operating frequency condition; and
   a driver configured to output the DQ signal by driving the encoding data based on the DQ scaling signal.

10. The memory device of claim 9, wherein the DQ scaling signal includes at least one of a power voltage of the driver and a code signal configured to control a turning on or off of a plurality of scaling transistors included in the driver.

11. The memory device of claim 10, wherein the power voltage of the driver is configured to vary depending on the operating frequency condition, and
   the code signal is configured such that a number of the plurality of scaling transistors that are turned on varies depending on the operating frequency condition.

12. The memory device of claim 9, wherein the driver comprises:
   a first pull-up circuit and a first pull-down circuit corresponding to a most significant bit (MSB) of the DQ signal; and
   a second pull-up circuit and a second pull-down circuit corresponding to a least significant bit (LSB) of the DQ signal.

13. The memory device of claim 12, wherein a plurality of transistors included in the first pull-up circuit and the first pull-down circuit have different characteristics from a plurality of transistors included in the second pull-up circuit and the second pull-down circuit.

14. A memory system comprising:
   a memory device including a memory cell array and a memory controller configured to control memory operations of the memory device,
   wherein the memory device and the memory controller are each configured to transmit or receive a scaled DQ signal that is modulated based on n-level pulse amplitude modulation (PAMn) (where n is an integer greater than or equal to four), and
   wherein at least one of an interval between adjacent levels of the n levels and/or a transition slope between adjacent levels of the n levels of the scaled DQ signal is scaled according to an operating frequency condition of the memory system.

15. The memory system of claim 14, wherein, when the operating frequency condition exceeds a reference value, the DQ signal is scaled such that at least one of the interval and/or the transition slope increases.

16. The memory system of claim 14, wherein, when the operating frequency condition is equal to or less than a reference value, the DQ signal is scaled such that at least one of an interval and/or a transition slope decreases.

17. The memory system of claim 14, wherein the memory device and the memory controller each include a driver configured to receive a power voltage that varies depending on the operating frequency condition, or which has a driving strength configured to vary depending on the operating frequency condition.

18. A method of operating a memory device, the method comprising:
   receiving a first read command according to a first operating frequency condition;
   generating and outputting a first DQ signal that is based on n-level pulse amplitude modulation (PAMn) and that corresponds to the first operating frequency condition, in response to the first read command;

receiving a second read command according to a second operating frequency condition that is different from the first operating frequency condition; and generating and outputting a second DQ signal that is based on the PAMn and that corresponds to the second operating frequency condition, in response to the second read command, wherein the first DQ signal is different from at least one of an interval between adjacent levels of the n levels and a transition slope between adjacent levels of the n levels of the second DQ signal, and wherein n is an integer greater than or equal to four.

19. The method of claim 18, further comprising:

receiving a signal indicating the first operating frequency condition;

determining a first DQ parameter for scaling at least one of the interval between the adjacent levels of the n levels and the transition slope between the adjacent levels of the n levels in the first DQ signal based on the first operating frequency condition;

receiving a signal indicating the second operating frequency condition; and determining a second DQ parameter for scaling at least one of the interval between the adjacent levels of the n levels and the transition slope between the adjacent levels of the n levels in the second DQ signal based on the second operating frequency condition, wherein the first DQ parameter is different from the second DQ parameter.

20. The method of claim 18, wherein the generating and outputting of the first DQ signal comprises:

reading data from a memory cell array;

generating encoding data by performing PAMn-based encoding on the read data;

driving the encoding data based on a power voltage or a driving strength that is scaled to correspond to the first operating frequency condition; and outputting the encoding data that is driven as the first DQ signal.

* * * * *